US012787860B2

(12) United States Patent
Chuang et al.

(10) Patent No.: US 12,787,860 B2
(45) Date of Patent: Nov. 3, 2026

(54) PACKAGE ON PACKAGE STRUCTURE WITH ENCAPSULATED HEAT SINK

(71) Applicant: Taiwan Semiconductor Manufacturing Company, Ltd., Hsinchu (TW)

(72) Inventors: Lipu Kris Chuang, Hsinchu City (TW); Hsin-Yu Pan, Taipei (TW); Tzu-Sung Huang, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 574 days.

(21) Appl. No.: 17/727,841

(22) Filed: Apr. 25, 2022

(65) Prior Publication Data

US 2023/0343764 A1 Oct. 26, 2023

(51) Int. Cl.

| | |
|---|---|
| ***H10W 90/00*** | (2026.01) |
| ***H10W 20/20*** | (2026.01) |
| ***H10W 40/22*** | (2026.01) |
| ***H10W 70/60*** | (2026.01) |
| ***H10W 70/685*** | (2026.01) |
| ***H10W 74/10*** | (2026.01) |

(52) U.S. Cl.

CPC .......... *H10W 90/00* (2026.01); *H10W 20/20* (2026.01); *H10W 40/22* (2026.01); *H10W 70/611* (2026.01); *H10W 70/685* (2026.01); *H10W 74/114* (2026.01); *H10W 90/722* (2026.01)

(58) Field of Classification Search

None

See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |

(Continued)

FOREIGN PATENT DOCUMENTS

| | | |
|---|---|---|
| TW | 201836066 | 10/2018 |
| TW | 202010066 | 3/2020 |

(Continued)

OTHER PUBLICATIONS

"Office Action of Taiwan Counterpart Application", issued on Jan. 5, 2024, p. 1-p. 10.

(Continued)

*Primary Examiner* — Julio J Maldonado
*Assistant Examiner* — Pinaki Das
(74) *Attorney, Agent, or Firm* — JCIPRNET

(57) ABSTRACT

A package structure including a chip stacking structure, a thermal enhance component and a first insulating encapsulant is provided. The thermal enhance component is stacked over and thermally coupled to the chip stacking structure, wherein a first lateral dimension of the thermal enhance component is greater than a second lateral dimension of the chip stacking structure. The first insulating encapsulant laterally encapsulates the thermal enhance component and the chip stacking structure.

20 Claims, 49 Drawing Sheets

(56) References Cited

U.S. PATENT DOCUMENTS

| | | | | |
|---|---|---|---|---|
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2007/0287265 | A1* | 12/2007 | Hatano | H01L 25/50 257/E21.597 |
| 2011/0241192 | A1* | 10/2011 | Ding | H01L 23/5389 438/109 |
| 2013/0037950 | A1* | 2/2013 | Yu | H01L 23/5226 257/E23.021 |
| 2015/0206865 | A1* | 7/2015 | Yu | H10W 90/00 257/737 |
| 2015/0279828 | A1* | 10/2015 | Koopmans | H10W 90/00 257/713 |
| 2015/0294939 | A1* | 10/2015 | Yu | H10W 90/00 438/107 |
| 2016/0233110 | A1 | 8/2016 | Zhou et al. | |
| 2017/0025342 | A1* | 1/2017 | Tseng | C25D 7/12 |
| 2017/0207197 | A1* | 7/2017 | Yu | H01L 24/92 |
| 2017/0207200 | A1* | 7/2017 | Lin | H01L 21/561 |
| 2023/0124783 | A1* | 4/2023 | Kim | H01L 25/105 257/712 |

FOREIGN PATENT DOCUMENTS

| | | |
|---|---|---|
| TW | 202209509 | 3/2022 |
| TW | 202228256 | 7/2022 |

OTHER PUBLICATIONS

"Office Action of Taiwan Counterpart Application", issued on Aug. 11, 2025, p. 1-p. 10.

* cited by examiner

PACKAGE ON PACKAGE STRUCTURE WITH ENCAPSULATED HEAT SINK

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example. In semiconductor fabrication, heat dissipation performance of semiconductor packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
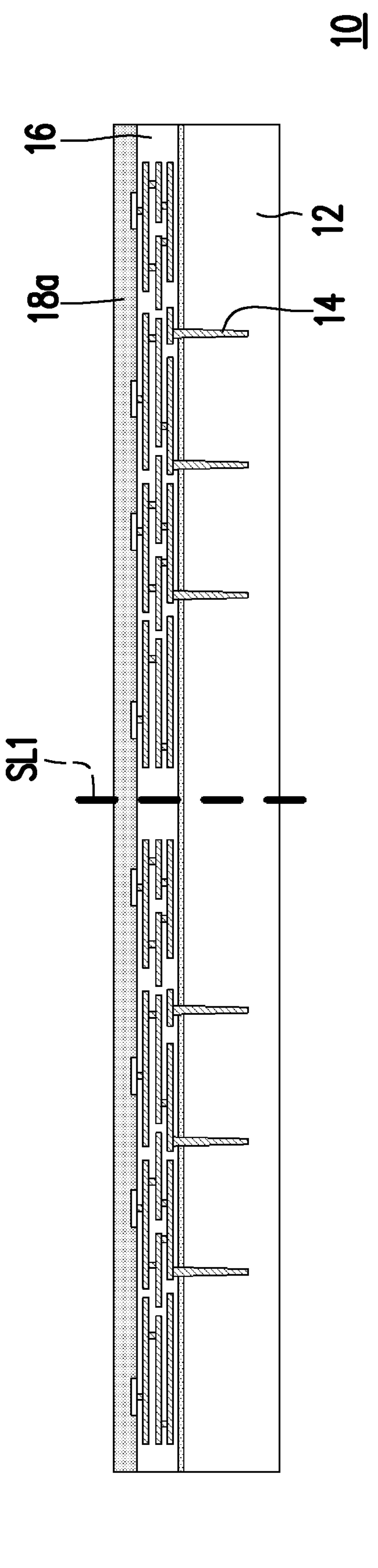
FIGS. 1A through 1M are cross-sectional views schematically illustrating a process flow for fabricating chip stacking structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase yields and decrease costs.

Package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1A through 1M are cross-sectional views schematically illustrating a process flow for fabricating chip stacking structures in accordance with some embodiments of the present disclosure.

Referring to FIG. 1A, a wafer 10 including semiconductor dies is provided. The semiconductor dies in the wafer 10 may be logic dies, System-on-Chip (SoC) dies or other suitable semiconductor dies. The wafer 10 is fabricated through, for example, N5 process. The wafer 10 may include a semiconductor substrate 12 (e.g., a semiconductor substrate), through substrate vias 14 embedded in the semiconductor substrate 12, an interconnect structure 16 disposed on the semiconductor substrate 12, and a bonding dielectric layer 18*a* disposed on the interconnect structure 16, wherein the through substrate vias 14 are electrically connected to the interconnect structure 116. The semiconductor substrate 12 of the semiconductor wafer 10 may include a crystalline silicon wafer. The semiconductor substrate 12 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the semiconductor substrate 12 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The through substrate vias 14 may be formed by forming recesses in the semiconductor substrate 12 by, for example, etching, milling, laser techniques, a combination thereof, or the like. A thin barrier layer may be conformally deposited over the front side of the semiconductor substrate 12 and in the openings, such as by chemical vapor deposition (CVD), atomic layer deposition (ALD), physical vapor deposition (PVD), thermal oxidation, a combination thereof, or the like. The barrier layer may comprise a nitride or an oxynitride, such as titanium nitride, titanium oxynitride, tantalum nitride, tantalum oxynitride, tungsten nitride, a combination thereof, or the like. A conductive material is deposited over the thin barrier layer and in the openings. The conductive material may be formed by an electro-chemical plating process, CVD, ALD, PVD, a combination thereof, or the like. Examples of conductive materials are copper, tungsten, aluminum, silver, gold, a combination thereof, or the like. Excess conductive material and barrier layer may be removed from the front side of the semiconductor substrate 12 by, for example, chemical mechanical polishing. Thus, in some embodiments, the through substrate vias 14 may comprise a conductive material and a thin barrier layer between the conductive material and the semiconductor substrate 12.

The interconnect structure 16 may include one or more dielectric layers (for example, one or more interlayer dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the semiconductor substrate 12 and/or the through substrate vias 14. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect wirings may include metallic wirings. For example, the interconnect wirings include copper wirings, copper pads, aluminum pads or combinations thereof. In some embodiments, the through substrate vias 14 extend through one or more layers of the interconnect structure 16 and into the semiconductor substrate 12.

The material of the bonding dielectric layer 18*a* may be silicon oxide ($SiO_x$, where x>0), silicon nitride ($SiN_x$, where x>0), silicon oxynitride ($SiO_xN_y$, where x>0 and y>0) or other suitable dielectric material. The bonding dielectric layer 18*a* may be formed by depositing a dielectric material through a chemical vapor deposition (CVD) process (e.g., a plasma enhanced CVD process or other suitable process).

Figure 1B:
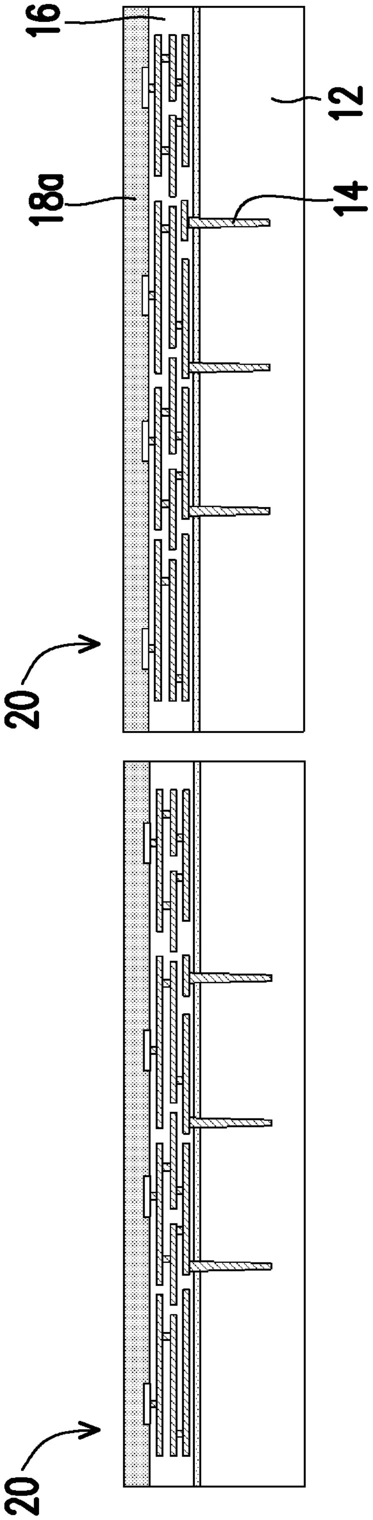

Referring to FIG. 1A and FIG. 1B, the semiconductor wafer 10 is singulated by a wafer sawing process performed along scribe lines SL1 such that singulated semiconductor dies 20 are obtained. Each of the singulated semiconductor dies 20 may include a semiconductor substrate 12, through substrate vias 14 embedded in the semiconductor substrate 12, an interconnect structure 16 disposed on the semiconductor substrate 12, and a bonding dielectric layer 18*a* disposed on the interconnect structure 16. As illustrated in FIG. 1B, the through substrate vias 14 are buried in the semiconductor substrate 12 and the interconnect structure 16. The through semiconductor vias 14 are not revealed from a back surface of the semiconductor substrate 12 at this stage.

Figure 1C:
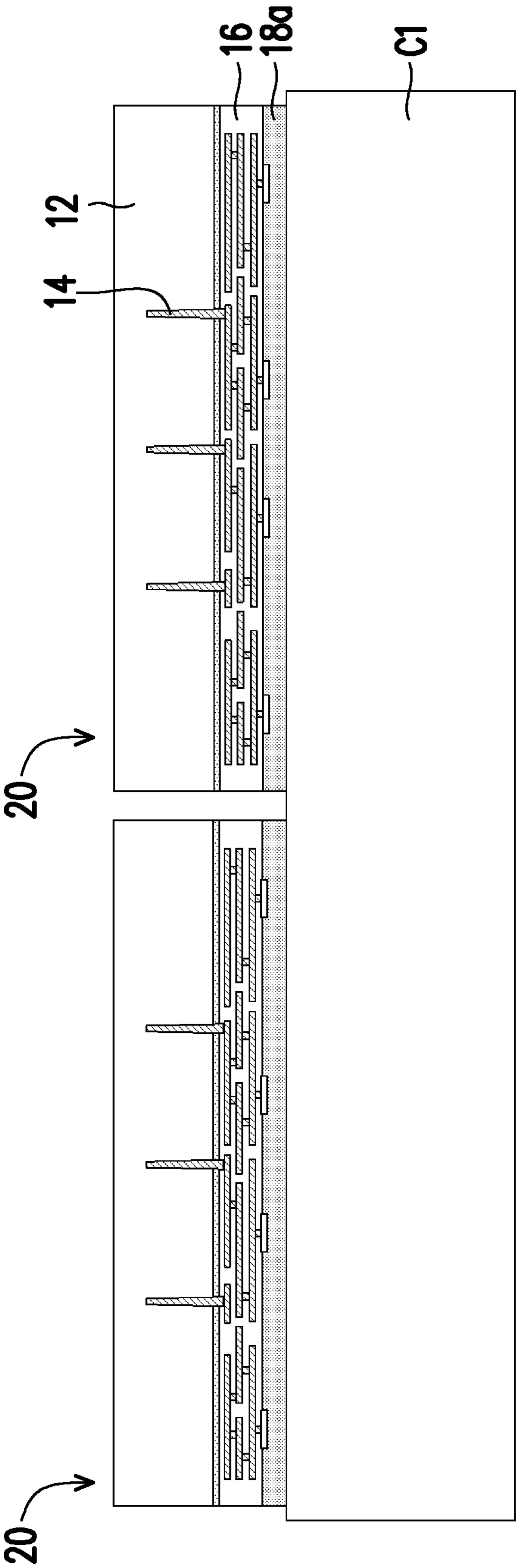

Referring to FIG. 1C, the singulated semiconductor dies 20 are picked-up and placed on a carrier C1 in side-by-side manner such that front surfaces of the singulated semiconductor dies 20 are bonded to the carrier C1. The carrier C1 may be a semiconductor wafer such as a silicon wafer. The carrier C1 may have a round top-view shape and a size of a silicon wafer. For example, carrier C1 may have an 8-inch diameter, a 12-inch diameter, or the like. The singulated semiconductor dies 20 are bonded to the carrier C1 through a chip-to-wafer bonding process. A bonding process is performed to bond the bonding dielectric layers 18*a* of the singulated semiconductor dies 20 with the carrier C1. The bonding process may be a direct bonding process. After performing the above-mentioned direct bonding process, a semiconductor-to-dielectric bonding interface such as silicon-to-nitride (Si—$SiN_x$) bonding interface may be formed between the bonding dielectric layer 18*a* and the carrier C1.

Figure 1D:
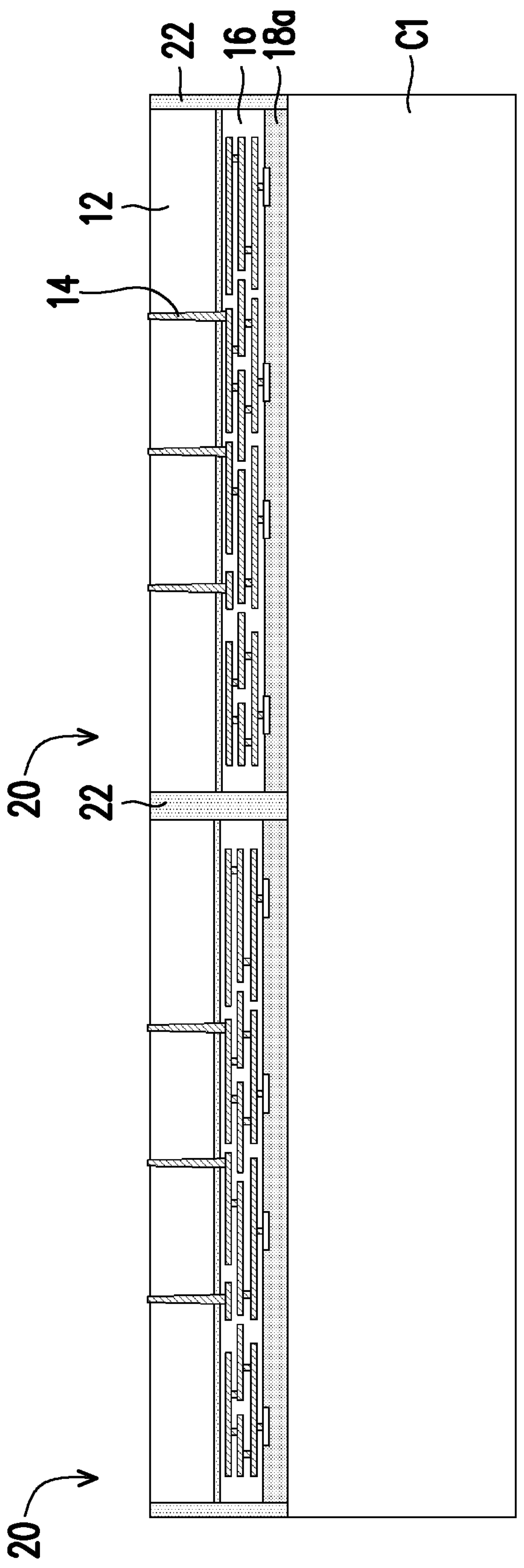

Referring to FIG. 1D, an insulating encapsulation material is formed over the carrier C1 to cover the singulated semiconductor dies 20 which are bonded with the carrier C1. The insulating encapsulation material may be a molding compound (e.g., epoxy or other suitable resin) formed through an over-molding process. The insulating encapsulation material fills the gaps between neighboring semiconductor dies 20 and covers back surfaces of the singulated semiconductor dies 20. After forming the insulating encapsulation material over the carrier C1, the insulating encapsulation material and the semiconductor substrates 12 of the semiconductor dies 20 are partially remove such that the semiconductor substrates 12 of the semiconductor dies 20 are thinned and an insulating encapsulant 22 are formed to laterally encapsulate the semiconductor dies 20. The insulating encapsulation material and the semiconductor substrate 12 of the semiconductor dies 20 may be partially remove through a planarization process such as a Chemical Mechanical Polish (CMP) process and/or a mechanical grinding process. After performing the above-mentioned planarization process, the thickness of the insulating encapsulant 22 is substantially equal to that of the semiconductor dies 20. In other words, the top surface of the insulating encapsulant 22 is substantially level with back surfaces of the semiconductor dies 20. As illustrated in FIG. 1D, after performing the above-mentioned planarization process, the through semiconductor vias 14 are revealed from the back surfaces of the semiconductor substrates 12 at this stage. The through semiconductor vias 14 may protrude from the back surfaces of the semiconductor substrates 12.

Figure 1E:
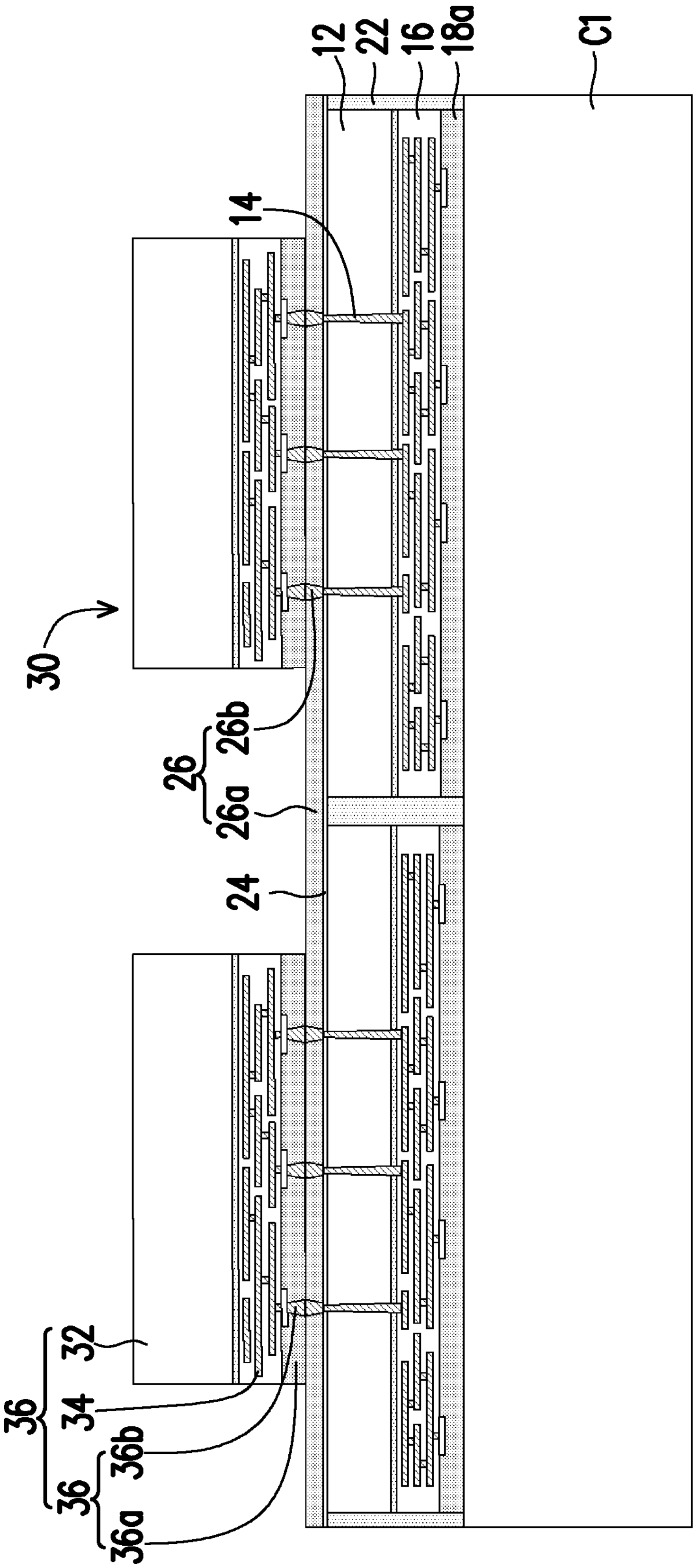

Referring to FIG. 1E, a dielectric material may be formed over the back surfaces of the semiconductor substrates 12 and the top surface of the insulating encapsulant 22 to cover the revealed through semiconductor vias 14. The dielectric material may be or include silicon oxide ($SiO_x$, where x>0), silicon nitride ($SiN_x$, where x>0), silicon oxynitride ($SiO_xN_y$, where x>0 and y>0) or other suitable dielectric material. A planarization process such as a Chemical Mechanical Polish (CMP) process and/or a mechanical grinding process may be performed to partially remove the dielectric material such that a planarization layer 24 is formed on the back surfaces of the semiconductor substrates 12 and the top surface of the insulating encapsulant 22. The top surface of the planarization layer 24 is substantially level with top ends of the through semiconductor vias 14.

After forming the planarization layer 24, a bonding structure 26 including a bonding dielectric layer 26*a* and bonding conductors 26*b* embedded in the bonding dielectric layer 26*a*. The material of the bonding dielectric layer 26*a* may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 26*b* may be conductive vias (e.g., copper vias), conductive pads (e.g., copper pads) or combinations thereof. The bonding structure 26 may be formed by depositing a dielectric material through a chemical vapor deposition (CVD) process (e.g., a plasma enhanced CVD process or other suitable process); patterning the dielectric material to form the bonding dielectric layer 26*a* including openings or through holes; and filling conductive material in the openings or through holes defined in the bonding dielectric layer 26*a* to form the bonding conductors 26*b* embedded in the bonding dielectric layer 26*a*. In some embodiments, the conductive material for forming the bonding conductors 26*b* may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

After forming the bonding structure 26, semiconductor dies 30 are provided on the bonding structure 26. The semiconductor dies 30 may be logic dies, System-on-Chip (SoC) dies or other suitable semiconductor dies. The semiconductor dies 30 are fabricated through, for example, N3 process. The semiconductor dies 20 and the semiconductor dies 30 may perform the same function or different functions. For example, the semiconductor dies 20 and the semiconductor dies 30 are System on Chip (SoC) dies. Each of the semiconductor dies 30 may respectively include a semiconductor substrate 32 and an interconnect structure 34 disposed on the semiconductor substrate 32. Furthermore, bonding structures 36 may be formed on the interconnect structures 34 of the semiconductor dies 30. The bonding structure 36 includes a bonding dielectric layer 36*a* and bonding conductors 36*b* embedded in the bonding dielectric layer 36*a*. The material of the bonding dielectric layer 36*a* may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 36*b* may be conductive vias (e.g., copper vias), conductive pads (e.g., copper pads) or combinations thereof. The bonding structure 36 may be formed by depositing a dielectric material through a chemical vapor deposition (CVD) process (e.g., a plasma enhanced CVD process or other suitable process); patterning the dielectric material to form the bonding dielectric layer 36*a* including openings or through holes; and filling conductive material in the openings or through holes defined in the bonding dielectric layer 36*a* to form the bonding conductors 36*b* embedded in the bonding dielectric layer 36*a*. In some embodiments, the conductive material for forming the bonding conductors 36*b* may be formed through a chemical vapor deposition (CVD) process (e.g., a plasma enhanced CVD process or other suitable process) followed by a planarization process (e.g., a Chemical Mechanical Polish (CMP) process and/or a mechanical grinding process).

A bonding process (e.g., a chip-to-wafer bonding process) is performed to bond the bonding structures 36 formed on the semiconductor dies 30 with bonding regions of the bonding structure 26. The bonding process may be a hybrid bonding process that includes dielectric-to-dielectric bonding and metal-to-metal bonding. After performing the above-mentioned bonding process, a dielectric-to-dielectric bonding interface is formed between the bonding dielectric layer 26*a* and the bonding dielectric layer 36*a*, and metal-to-metal bonding interfaces are formed between the bonding conductors 26*b* and bonding conductors 36*b*. After performing the bonding process, the semiconductor dies 30 are electrically connected to the semiconductor dies 20 through the bonding structures 36 and the bonding structure 26.

As illustrated in FIG. 1E, the semiconductor dies 30 may be disposed above the semiconductor dies 20. The lateral dimension (e.g., width and/or length) of the semiconductor dies 20 may be greater than the lateral dimension (e.g., width and/or length) of the semiconductor dies 30. In other words, the footprint of the semiconductor dies 20 may be greater than that of the semiconductor dies 30. Since the bonding structures 36 are merely bonded with bonding regions of the bonding structure 26, portions of the bonding dielectric layer 26*a* are not covered by the bonding structures 36.

Figure 1F:
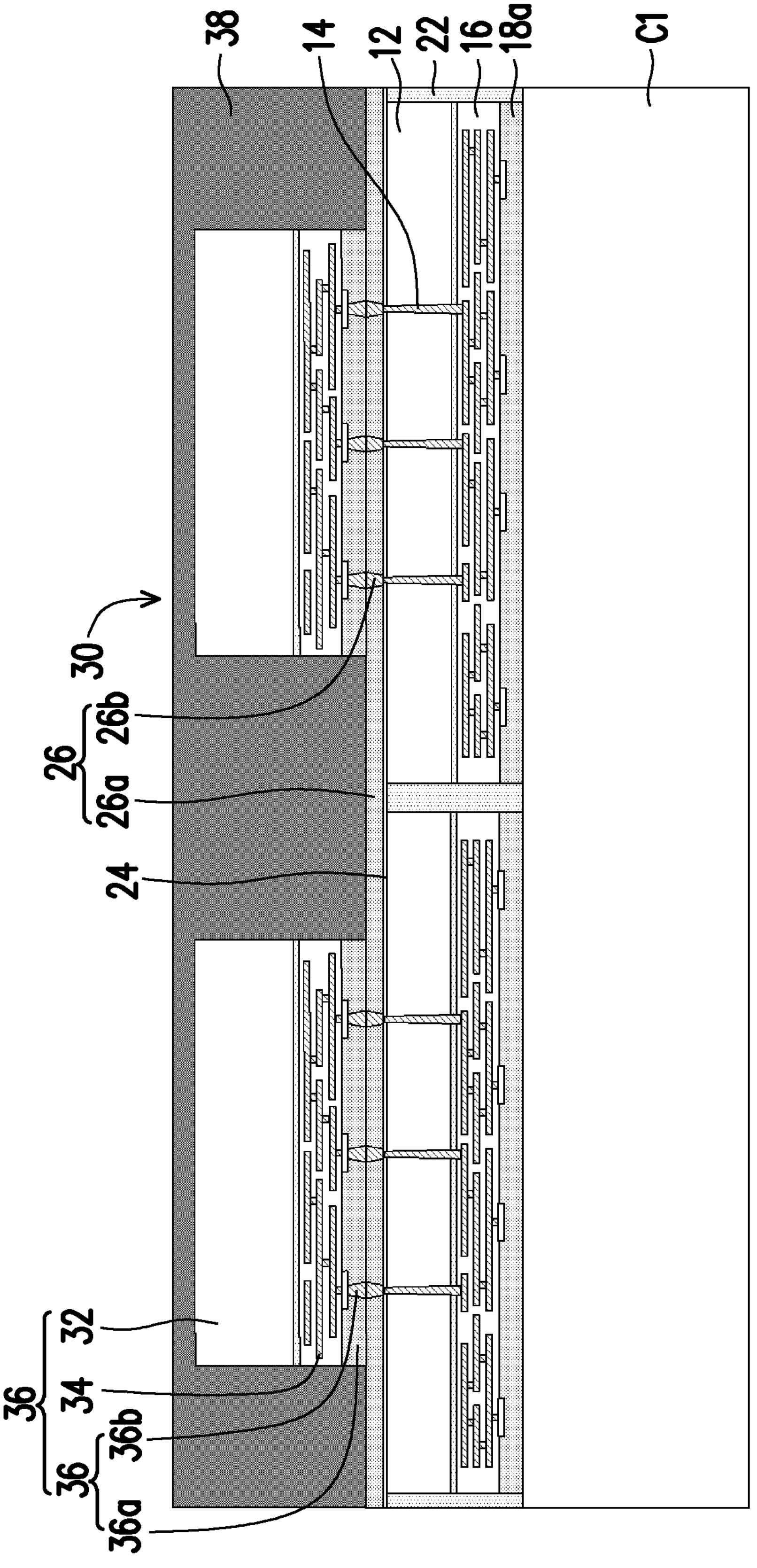
Figure 1G:
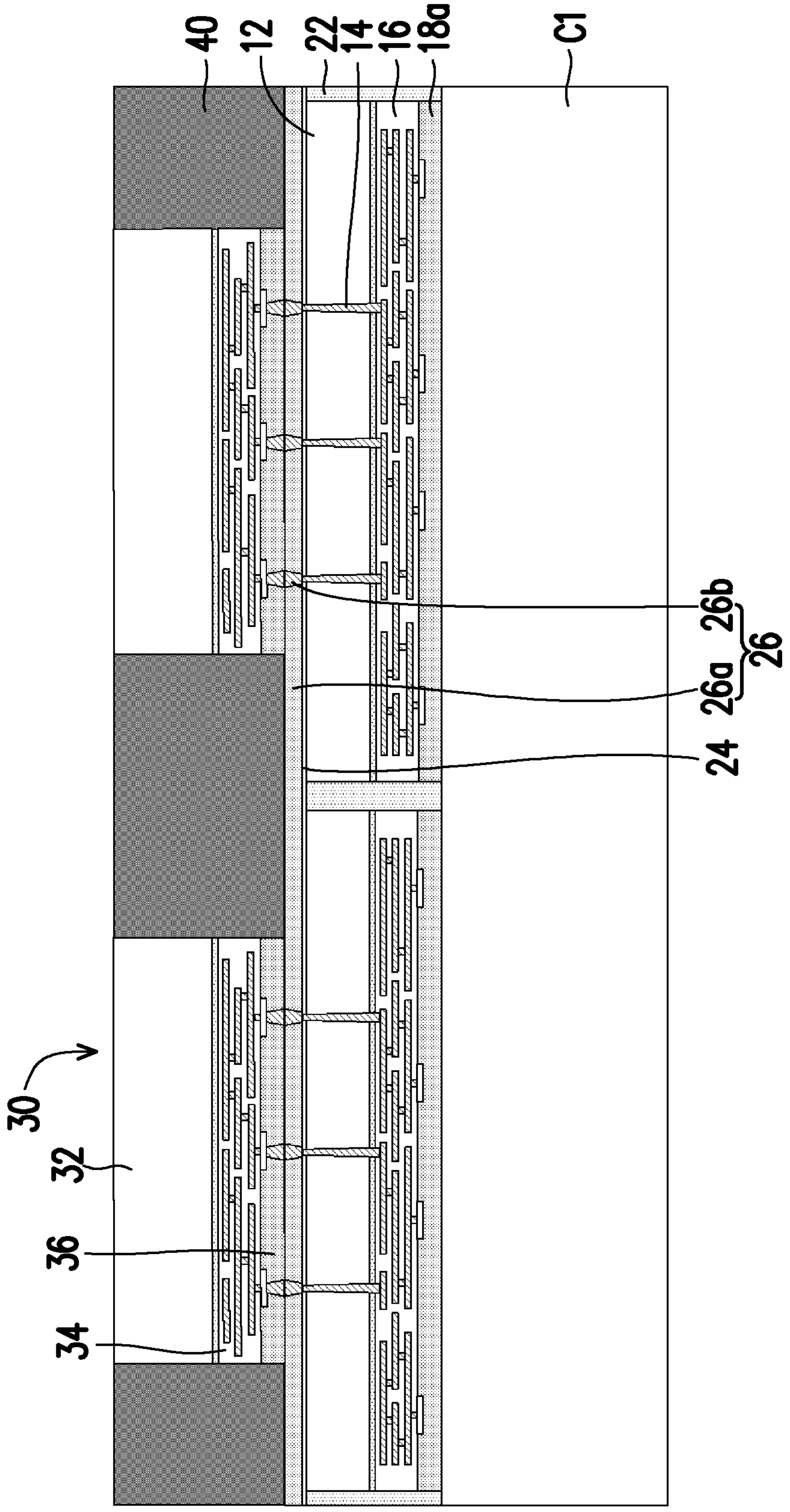

Referring to FIG. 1F and FIG. 1G, an insulating encapsulation material 38 is formed to cover the back surface of the semiconductor dies 30, sidewalls of the semiconductor dies 30, sidewalls of the bonding structures 36 and the portions of the bonding dielectric layer 26*a* which are not covered by the bonding structures 36. The insulating encapsulation material 38 may be a molding compound (e.g., epoxy or other suitable resin) formed through an over-molding process. The insulating encapsulation material 38 fills the gaps between neighboring semiconductor dies 30. After forming the insulating encapsulation material 38, the insulating encapsulation material 38 is partially removed until the semiconductor substrates 32 of the semiconductor dies 30 are revealed such that an insulating encapsulant 40 is formed. The insulating encapsulation material 38 may be partially removed through a planarization process such as a Chemical Mechanical Polish (CMP) process and/or a mechanical grinding process. After performing the above-mentioned planarization process, the top surface of the insulating encapsulant 40 is substantially level with back surfaces of the semiconductor dies 30.

Figure 1H:
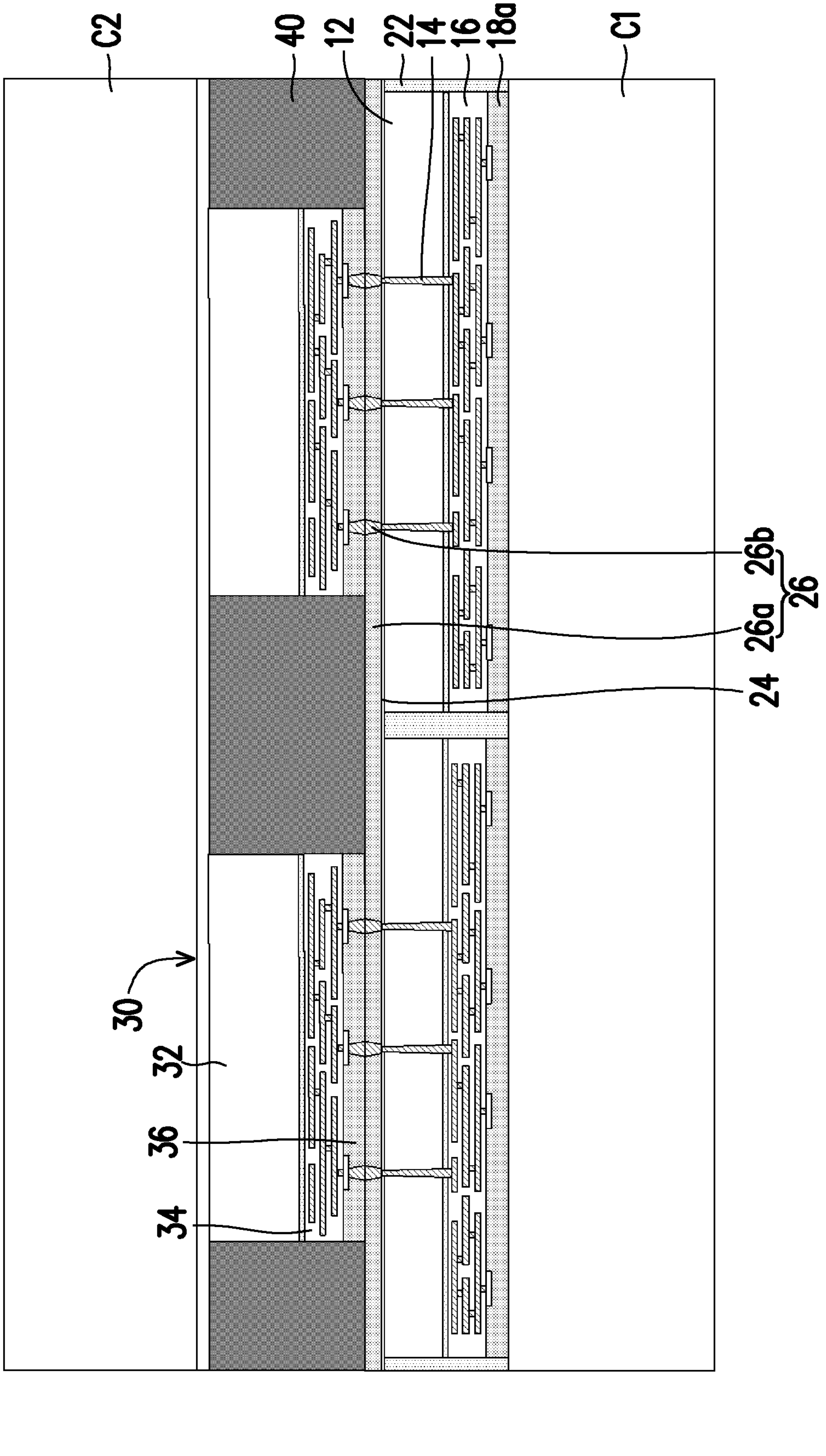

Referring to FIG. 1H, a carrier C2 including a de-bonding layer 42 formed thereon is provided. In some embodiments, the carrier C2 is a glass substrate, a ceramic carrier, or the like. The carrier C2 may have a round top-view shape and a size of a glass substrate. For example, carrier C2 may have an 8-inch diameter, a 12-inch diameter, or the like. The de-bonding layer 42 may be formed of a polymer-based material (e.g., a Light To Heat Conversion (LTHC) material), which may be subsequently removed along with the carrier C2. In some embodiments, the de-bonding layer 42 is formed of an epoxy-based thermal-release material. In other embodiments, the de-bonding layer 42 is formed of an ultra-violet (UV) glue. The de-bonding layer 42 may be dispensed as a liquid and cured. In alternative embodiments, the de-bonding layer 42 is a laminate film and is laminated onto the carrier C2. The top surface of the de-bonding layer 42 is substantially planar.

A bonding process (e.g., a wafer-to-wafer bonding process) is performed to bond the resulted structure formed on the carrier C1 with the de-bonding layer 42 carried by the carrier C2. After the resulted structure formed on the carrier C1 is bonded with the de-bonding layer 42 carried by the carrier C2, the top surface of the insulating encapsulant 40 and the back surfaces of the semiconductor dies 30 are in contact with the de-bonding layer 42.

Figure 1I:
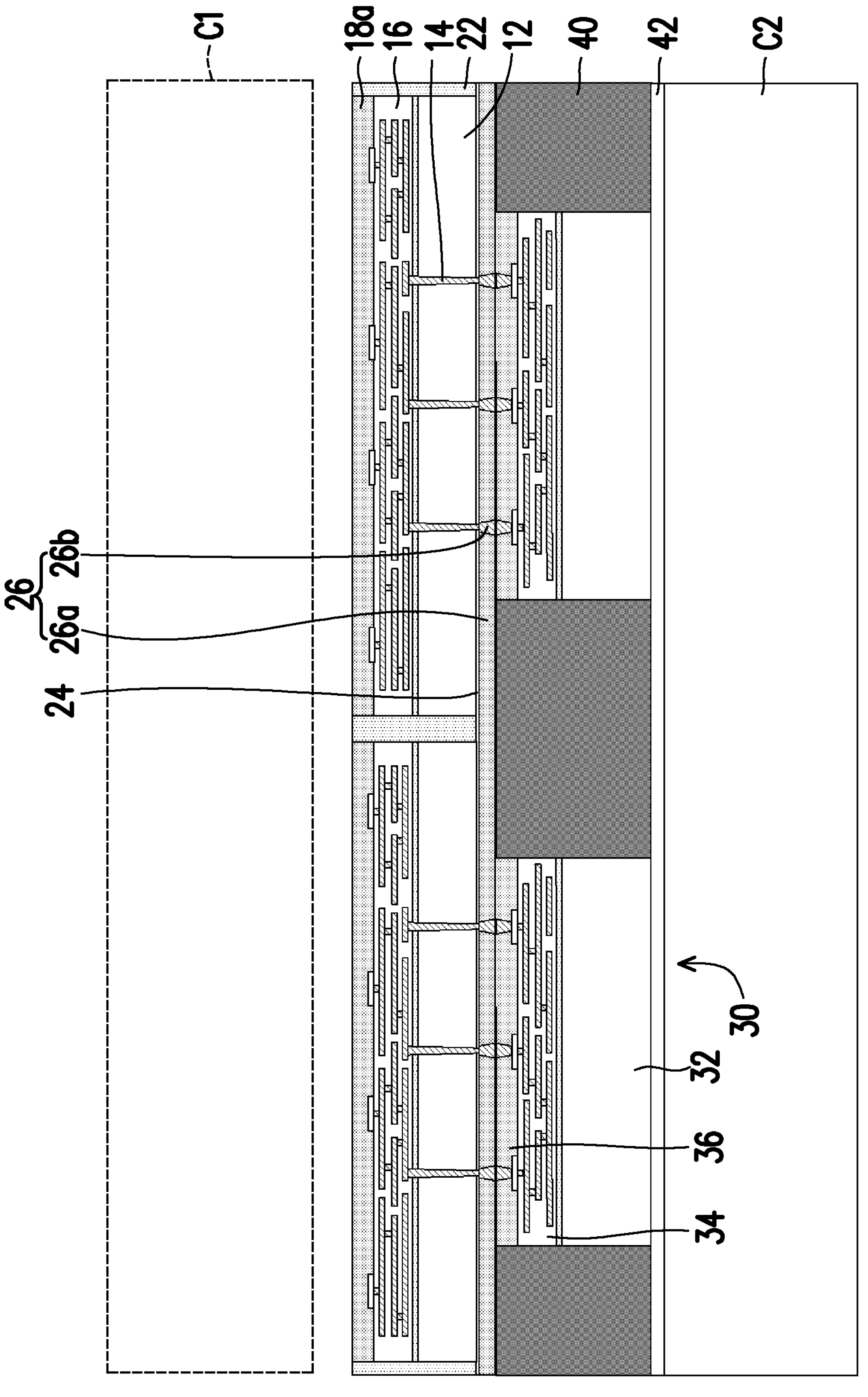

Referring to FIG. 1H and FIG. 1I, after the resulted structure formed on the carrier C1 is bonded with the de-bonding layer 42 carried by the carrier C2, the carrier C1 is de-bonded from the bonding dielectric layers 18*a* and the insulating encapsulant 22 such that the bonding dielectric layers 18*a* and the insulating encapsulant 22 are revealed.

Figure 1J:
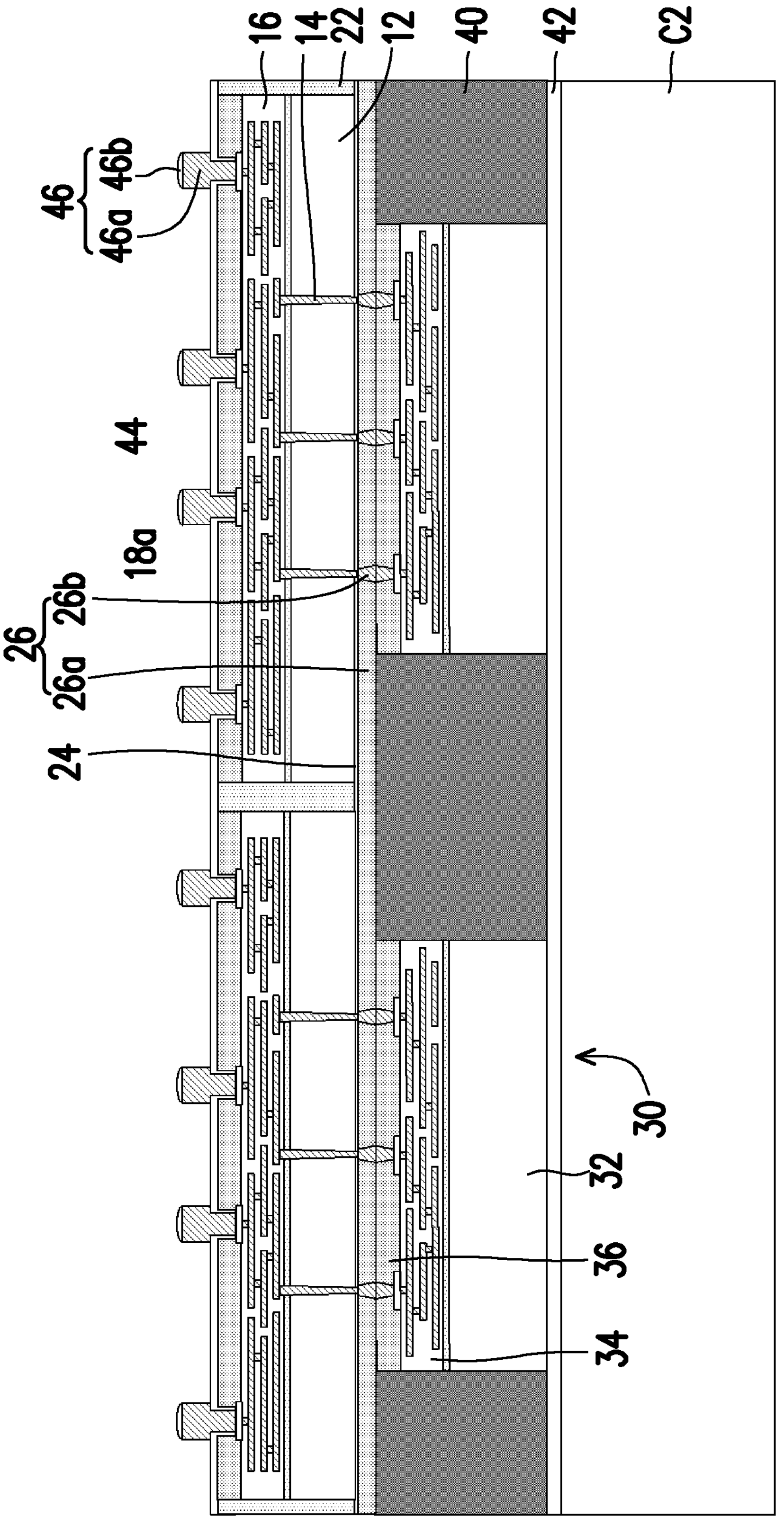

Referring to FIG. 1I and FIG. 1J, the bonding dielectric layers 18*a* is patterned to form openings such that the topmost interconnect wirings of the interconnect structures 16 are revealed by the openings formed in the bonding dielectric layers 18*a*. The formation of the openings in the bonding dielectric layers 18a may be performed through a photolithography process. A passivation layer 44 including openings formed therein may be formed to cover the bonding dielectric layers 18a such that the topmost interconnect wirings of the interconnect structures 16 revealed by the openings of the passivation layer 44. The formation of the openings in the passivation layer 44 may be performed through a photolithography process. The width of the openings defined in the passivation layer 44 may be smaller than the width of the openings defined in the bonding dielectric layers 18a. The passivation layer 44 may cover the top surfaces of the bonding dielectric layers 18a and the insulating encapsulant 22. The passivation layer 44 may further extend into the openings defined in the bonding dielectric layers 18a such that the passivation layer 44 is in contact with the topmost interconnect wirings of the interconnect structures 16.

After forming the passivation layer 44, conductive terminals 46 are formed over the passivation layer 44. The conductive terminals 46 are electrically connected to the interconnect wirings of the interconnect structures 16 and protrude from the passivation layer 44. Each of the conductive terminals 46 may respectively include a conductive pillar 46a and a solder cap 46b disposed on the conductive pillar 46a. The conductive pillars 46a fill the openings defined in the passivation layer 44 and protrude from the passivation layer 44. The solder caps 46b covers the top surfaces of the conductive pillars 46a. After forming the conductive terminals 46, a chip probing process may be performed to increase yields. The formation of the conductive terminals 46 may include forming a seed layer (not shown) over the passivation layer 44, forming a patterned mask (not shown) such as a photoresist layer over the seed layer, and then performing a plating process on the exposed seed layer. The patterned mask and the portions of the seed layer covered by the patterned mask are then removed, leaving the conductive terminals 46. A reflow process may be further performed to re-shape the profile of the solder caps 46a. In accordance with some embodiments, the seed layer includes a titanium layer and a copper layer over the titanium layer. The seed layer may be formed using, for example, Physical Vapor Deposition (PVD). The plating may be performed using, for example, electroless plating.

Figure 1K:
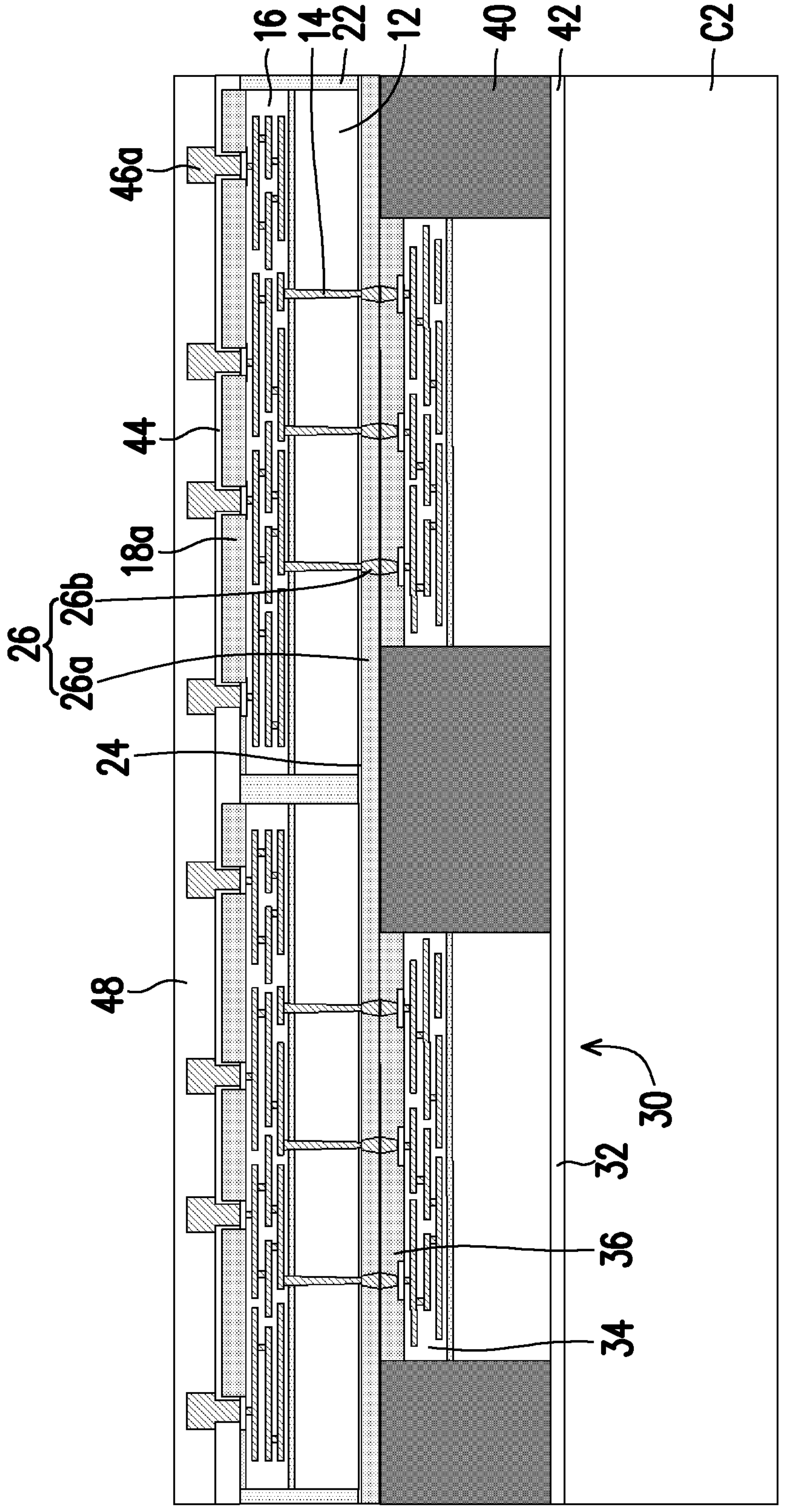

Referring to FIG. 1J and FIG. 1K, after performing the chip probing process, the solder caps 46b are removed and a dielectric layer 48 is formed over the passivation layer 44 to cover the conductive pillars 46a. In some embodiments, the dielectric layer 48 is formed of a polymer, which may be a photo-sensitive material such as polybenzoxazole (PBO), polyimide, benzocyclobutene (BCB), or the like. In some other embodiments, the dielectric layer 48 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 1L:
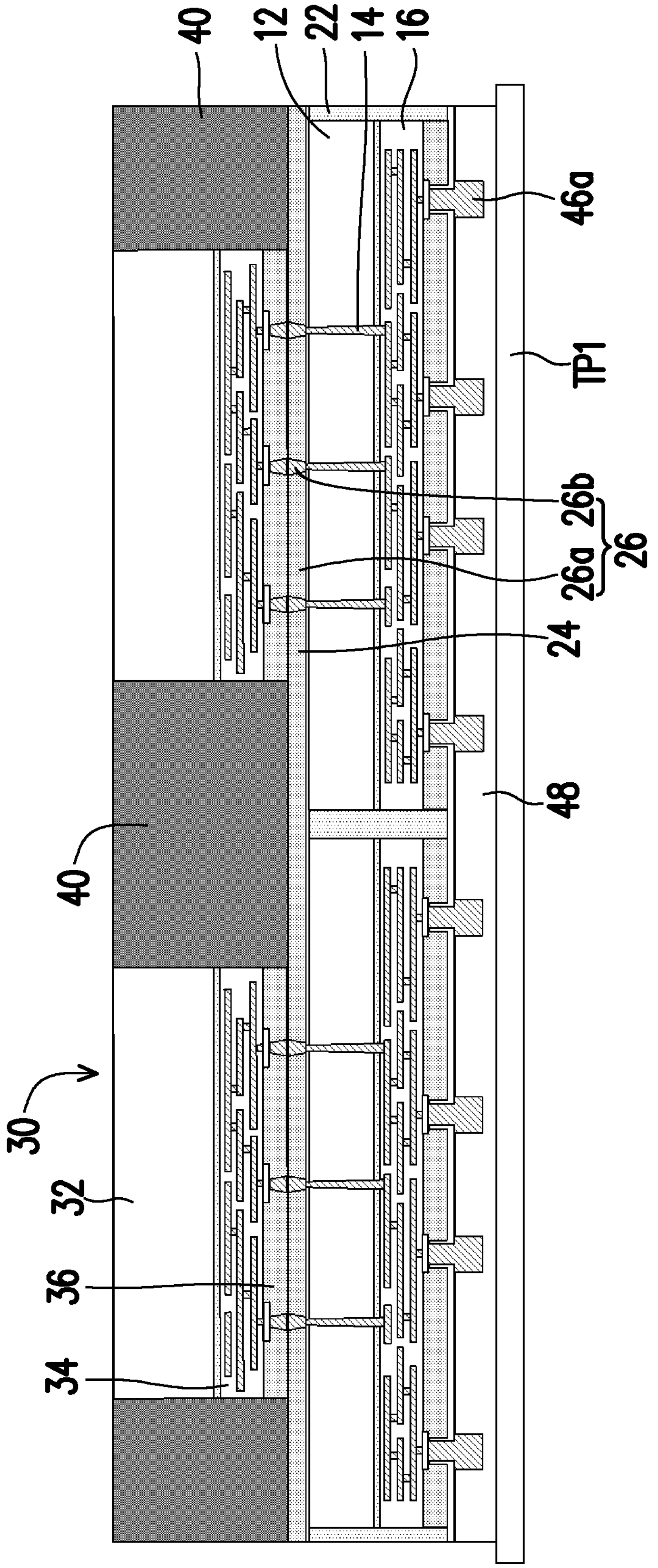

Referring to FIG. 1K and FIG. 1L, a frame mount process is performed such that the resulted structure carried by the carrier C2 is mounted on a tape TP1 carried by a frame. After performing the frame mount process, the dielectric layer 48 is attached on the tape TP1, and a de-bonding process is then performed such that the carrier C2 is de-bonded from the semiconductor dies 30 and the insulating encapsulant 40. After performing the de-bonding process, the back surfaces of the semiconductor dies 30 and the insulating encapsulant 40 are revealed. During the de-bonding process, the de-bonding layer 42 is also cleaned from the semiconductor dies 30 and the insulating encapsulant 40. The de-bonding may be performed by irradiating a light such as UV light or laser on the de-bonding layer 42 to decompose the de-bonding layer 42.

Figure 1M:
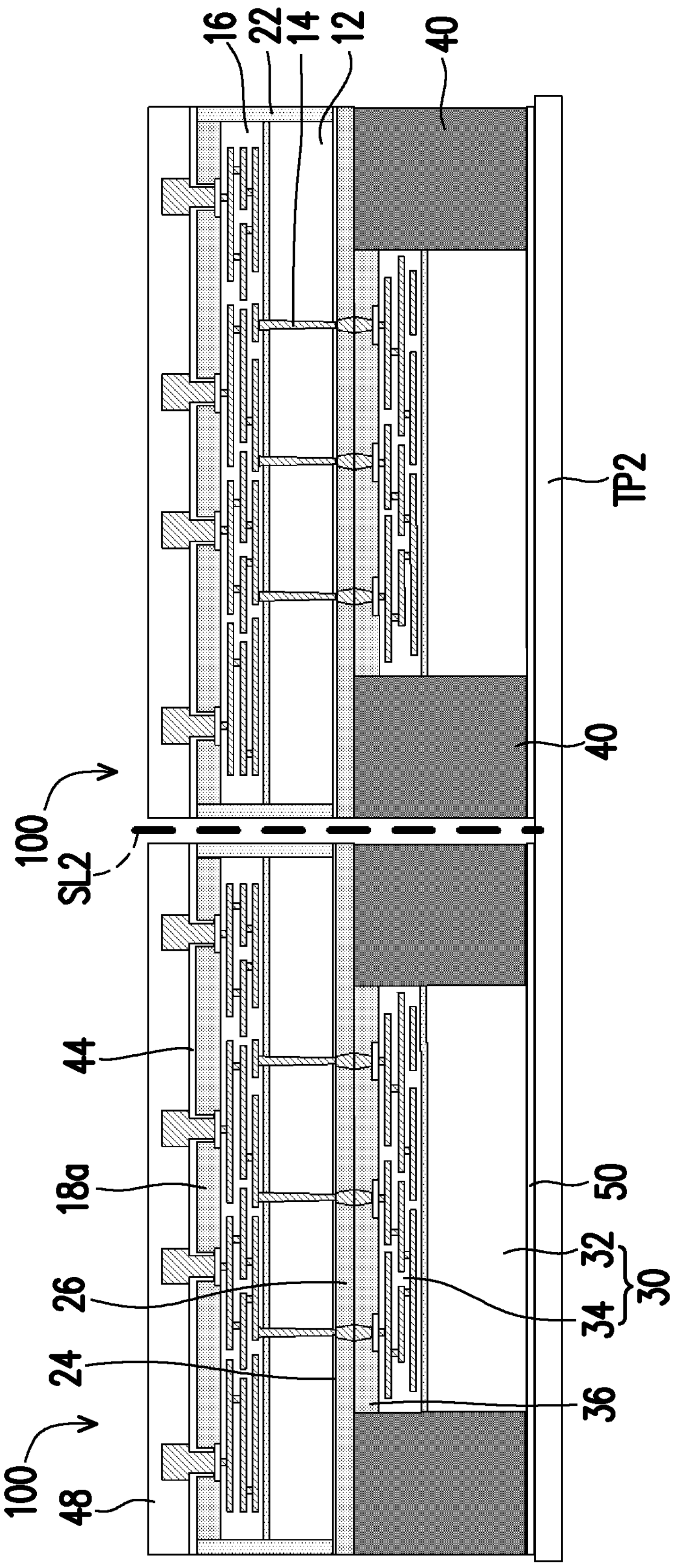

Referring to FIG. 1L and FIG. 1M, a tape TP2 carried by another frame is provided, wherein an attachment film 50 is formed on the tape TP. The resulted structure carried by the tape TP1 is transfer bonded onto the attachment film 50. Then, a singulation process is performed along scribe lines SL2 such that singulated chip stacking structures 100 (i.e., SoIC structures) are obtained. During the singulation process, the dielectric layer 48, the passivation layer 44, the insulating encapsulant 22, the planarization layer 24, the bonding structure 26, the insulating encapsulant 40 and the attachment film 50 are cut along scribe lines SL2. In some embodiments, the insulating encapsulant 22 laterally encapsulating the semiconductor die 20, wherein sidewalls of the 40 insulating encapsulant are substantially aligned with sidewalls of the insulating encapsulant 22.

FIGS. 2A through 2I are cross-sectional views schematically illustrating a process flow for fabricating a PoP structure in accordance with some embodiments of the present disclosure.

Figure 2A:
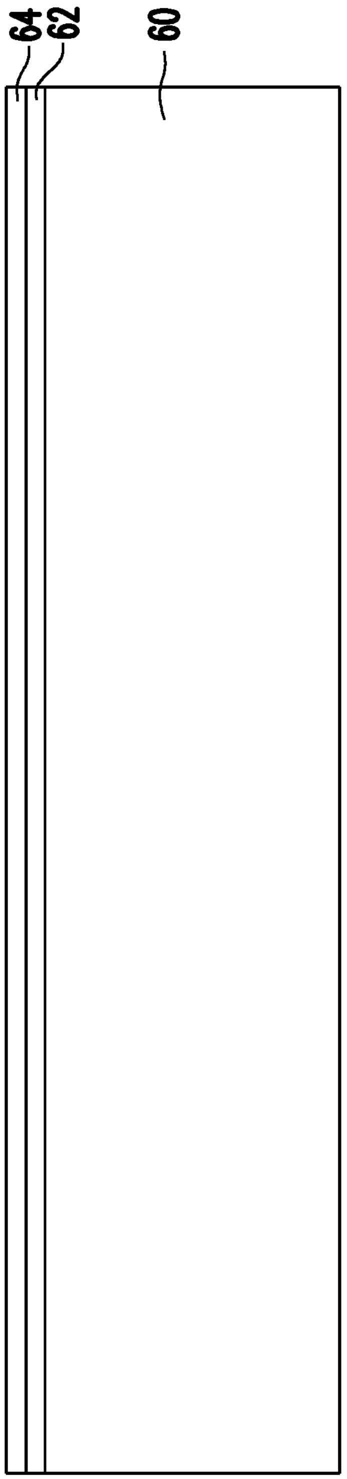
FIGS. 2A through 2I are cross-sectional views schematically illustrating a process flow for fabricating a Package-on-Package (PoP) structure in accordance with some embodiments of the present disclosure.

Referring to FIG. 2A, a carrier 60 including a de-bonding layer 62 formed thereon is provided. In some embodiments, the carrier 60 is a glass substrate, a ceramic carrier, or the like. The carrier 60 may have a round top-view shape and a size of a silicon wafer. For example, carrier 60 may have an 8-inch diameter, a 12-inch diameter, or the like. The de-bonding layer 62 may be formed of a polymer-based material (e.g., a Light To Heat Conversion (LTHC) material), which may be subsequently removed along with the carrier 60 from the overlying structures that will be formed in subsequent steps. In some embodiments, the de-bonding layer 62 is formed of an epoxy-based thermal-release material. In other embodiments, the de-bonding layer 62 is formed of an ultra-violet (UV) glue. The de-bonding layer 62 may be dispensed as a liquid and cured. In alternative embodiments, the de-bonding layer 62 is a laminate film and is laminated onto the carrier 60. The top surface of the de-bonding layer 62 is substantially planar.

Figure 2B:
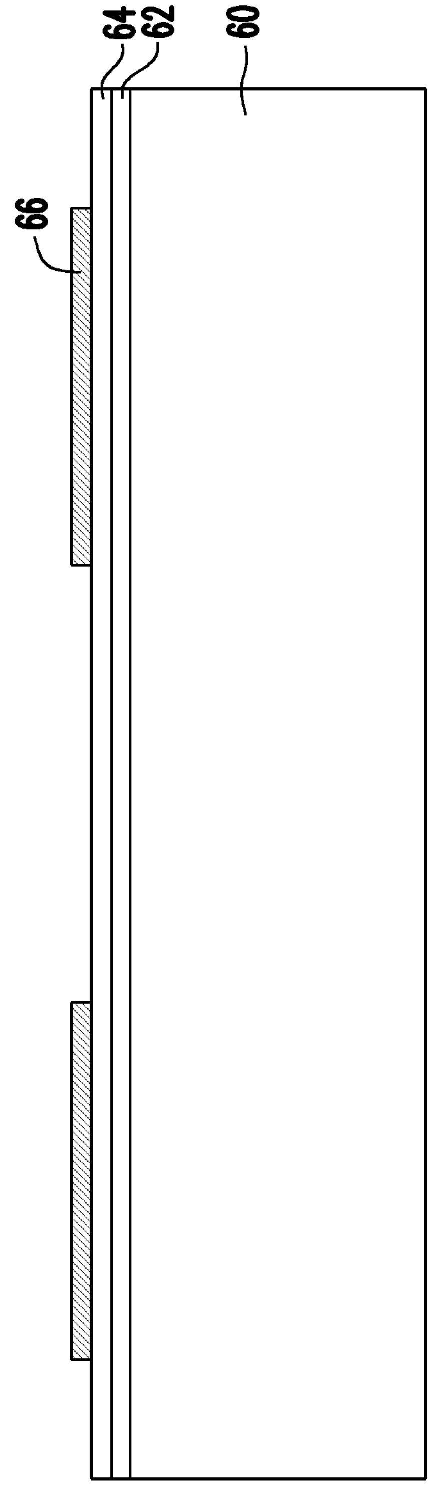
Figure 2C:
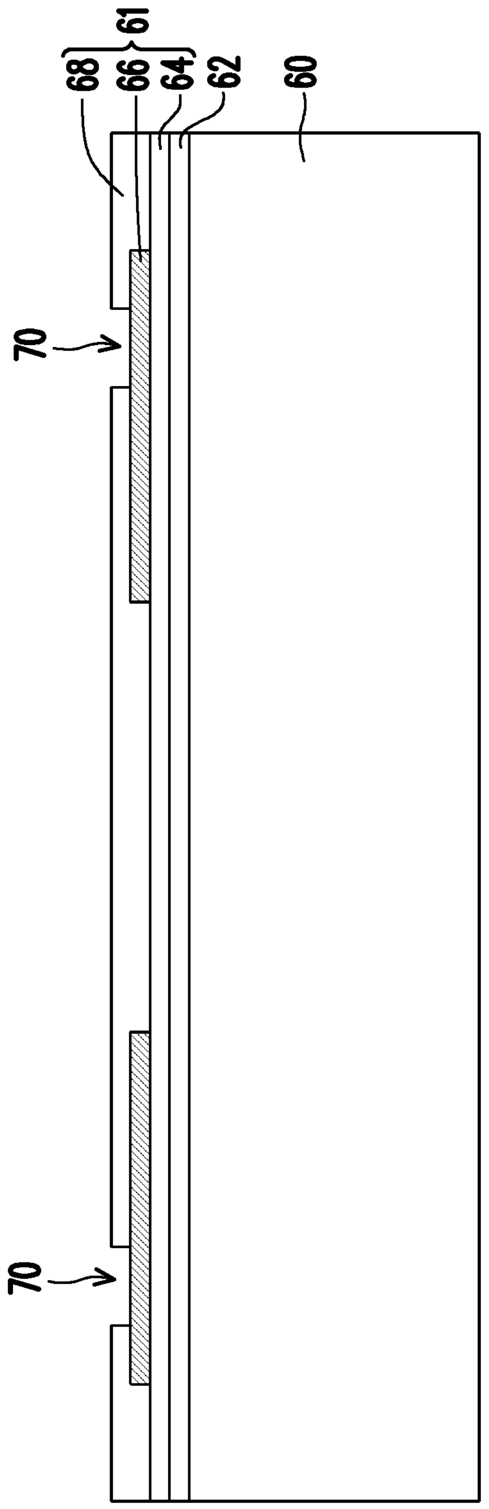

Referring to FIGS. 2A through 2C, a redistribution circuit structure 61 including a dielectric layer 64, redistribution wirings 66 and a dielectric layer 68 is formed on the de-bonding layer 62 such that the de-bonding layer 62 is between the carrier 60 and the dielectric layer 64 of the redistribution circuit structure 61. As shown in FIG. 2A, the dielectric layer 64 is formed on the de-bonding layer 62. In some embodiments, the dielectric layer 64 is formed of a polymer, which may also be a photo-sensitive material such as polybenzoxazole (PBO), polyimide, benzocyclobutene (BCB), or the like, which may be easily patterned using a photolithography process. In some embodiments, the dielectric layer 64 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. As shown in FIG. 2B, the redistribution wirings 66 are formed over the dielectric layer 64. The formation of the redistribution wirings 66 may include forming a seed layer (not shown) over the dielectric layer 64, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 66 as shown in FIG. 2B. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 2C, the dielectric layer 68 is formed over the dielectric layer 64 to cover the redistribution wirings 66. The bottom surface of the dielectric layer 68 is in contact with the top surfaces of the redistribution wirings 66 and the dielectric layer 64. In accordance with some embodiments of the present disclosure, the dielectric layer 68 is formed of a polymer, which may be a photo-sensitive material such as PBO, polyimide, BCB, or the like. In some embodiments, the dielectric layer 68 is formed of a nitride such as silicon nitride, an oxide such as silicon oxide, PSG, BSG, BPSG, or the like. The dielectric layer 68 is then patterned to form openings 70 therein. Hence, portions of the redistribution wirings 66 are exposed through the openings 70 in the dielectric layer 68. FIG. 2C and the subsequent figures illustrate a single redistribution circuit structure 61 having a single layer of redistribution wirings 66 for illustrative purposes and some embodiments may have a plurality of layers of redistribution wirings 66 by repeating the process discussed above.

Figure 2D:
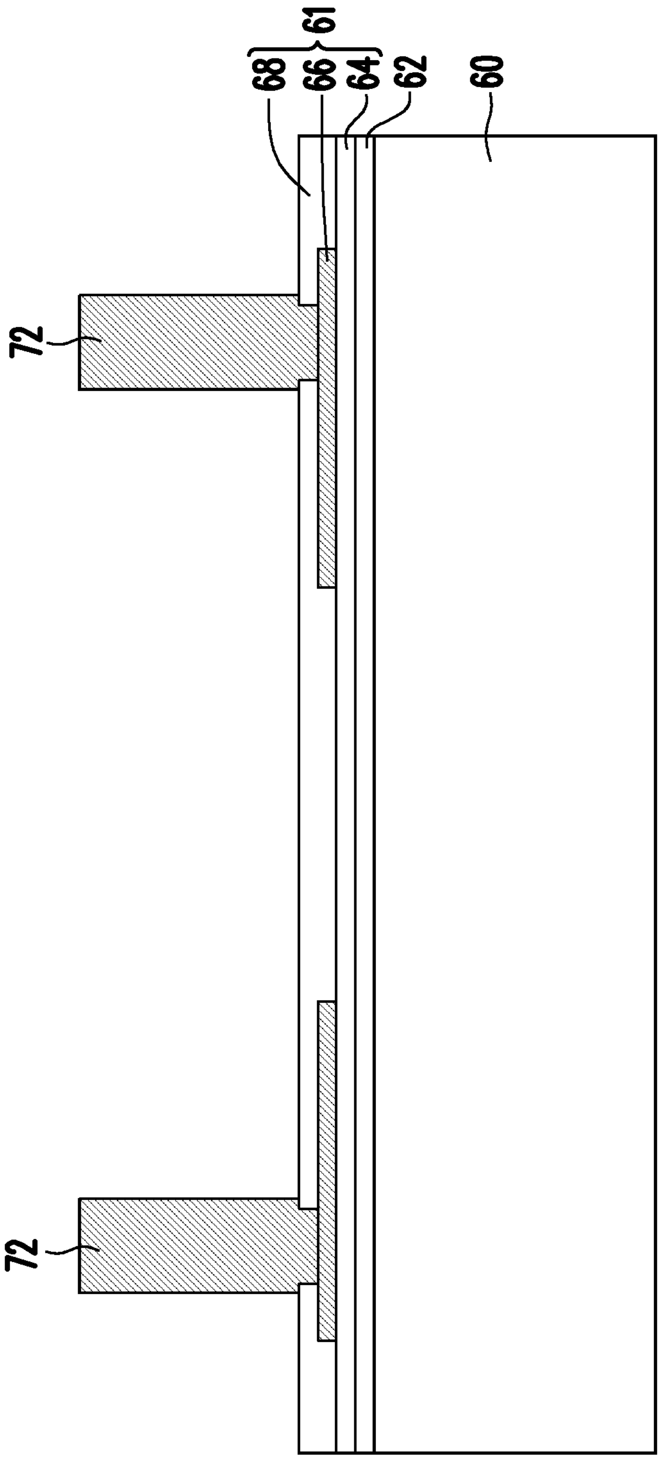

Referring to FIG. 2D, after forming the redistribution circuit structure 61 over the de-bonding layer 62 carried by the carrier 60, metal posts 72 are formed on the redistribution circuit structure 61 and electrically connected to the redistribution wirings 66 of the redistribution circuit structure 61. Throughout the description, the metal posts 72 are alternatively referred to as conductive through vias 72 since the metal posts 72 penetrate through the subsequently formed molding material (shown in FIG. 2G). In some embodiments, the conductive through vias 72 are formed by plating. The plating of the conductive through vias 72 may include forming a blanket seed layer (not shown) over the dielectric layer 68 and extending into the openings 70 shown in FIG. 2C, forming and patterning a photoresist (not shown), and plating the conductive through vias 72 on the portions of the seed layer that are exposed through the openings in the photoresist. The photoresist and the portions of the seed layer that were covered by the photoresist are then removed. The material of the conductive through vias 72 may include copper, aluminum, or the like. The conductive through vias 72 may have the shape of rods. The top-view shapes of the conductive through vias 72 may be circles, rectangles, squares, hexagons, or the like.

Figure 2E:
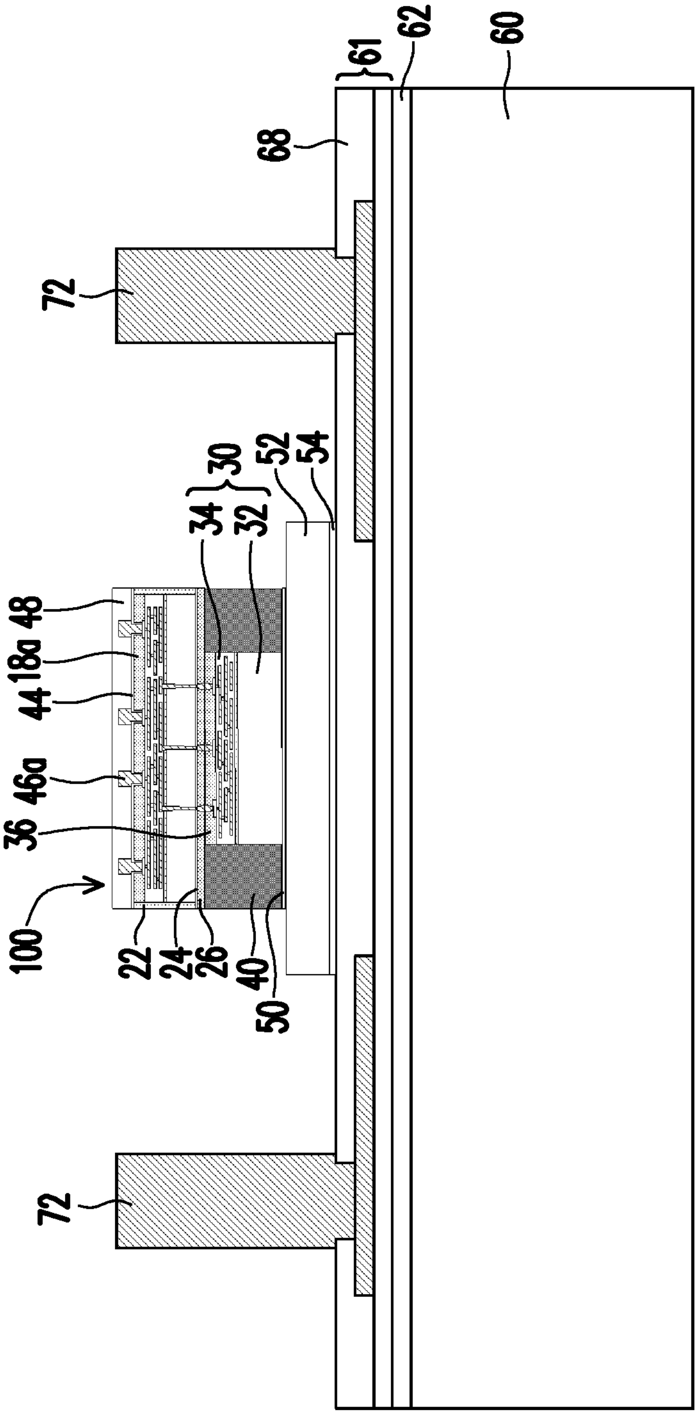

Referring FIG. 2E, after forming the conductive through vias 72, a thermal enhance component 52 (i.e., a heat sink) is provided. In some embodiments, the thermal enhance component 52 includes a semiconductor substrate or a conductive substrate, the semiconductor substrate or the conductive substrate is picked-up and placed over the dielectric layer 68 of the redistribution circuit structure 61, and the semiconductor substrate or the conductive substrate is attached to the dielectric layer 68 of the redistribution circuit structure 61 through an attachment film 54. In some other embodiments, as illustrated in FIG. 3B, the thermal enhance component 52 includes a conductive layer (e.g., a copper layer, a copper alloy layer or other suitable metallic layers), the conductive layer is formed on the dielectric layer 68 of the redistribution circuit structure 61 through an electroplating process, a dispensing process or other suitable deposition processes, and the conductive layer is in direct contact with the dielectric layer 68 of the redistribution circuit structure 61. In other words, as illustrated in FIG. 3B, the attachment film 54 shown in FIG. 2E is optional.

After the thermal enhance component 52 (i.e., a heat sink) is attached to dielectric layer 68 of the redistribution circuit structure 61, at least one singulated chip stacking structure 100 is picked-up and placed over the thermal enhance component 52. Only a single chip stacking structure 100 and its surrounding conductive through vias 72 are illustrated in FIG. 2E for illustrative purposes. It is noted, however, that the process steps shown in FIGS. 2A through 2I may be performed at wafer level, and may be performed on the thermal enhance component 52, multiple chip stacking structure 100 and the conductive through vias 72 disposed over the carrier 60. The chip stacking structure 100 and the thermal enhance component 52 are surrounded by the conductive through vias 72. As illustrated in FIG. 2E, the attachment film 50 in the chip stacking structure 100 is adhered to the thermal enhance component 52. The lateral dimension of the attachment film 54 is greater than the lateral dimension of the attachment film 50 or the chip stacking structure 100. In other words, the footprint of the attachment film 54 is greater than that of the attachment film 50 or the chip stacking structure 100. Furthermore, the lateral dimension of the thermal enhance component 52 is greater than the lateral dimension of the attachment film 50.

In some embodiments, the thickness of the thermal enhance component 52 ranges from about 50 nm to about 90 nm, the thickness of the semiconductor die 30 ranges from about 120 nm to about 140 nm, the thickness of the attachment film 50 ranges from about 10 nm to about 20 nm, and the thickness of the attachment film 54 ranges from about 10 nm to about 20 nm. For example, the thickness of the thermal enhance component 52 is about 55 nm or 85 nm, the thickness of the semiconductor die 30 is about 130 nm, the thickness of the attachment film 50 is about 15 nm, and the thickness of the attachment film 54 is about 15 nm.

In some embodiments, the size of the thermal enhance component 52 is 11 mm×11 mm, the die size of the semiconductor die 30 is 6.42 mm×6.42 mm, and the ratio of the size of the thermal enhance component 52 to the die size of the semiconductor die 30 is about 2.93. In some other embodiments, the size of the thermal enhance component 52 is 11 mm×11 mm, the die size of the semiconductor die 30 is 9.2 mm×9.2 mm, and the ratio of the size of the thermal enhance component 52 to the die size of the semiconductor die 30 is about 1.43. When the ratio of the size of the thermal enhance component 52 to the die size of the semiconductor die 30 increases, the thermal enhance component 52 may provide better thermal enhancement.

Figure 2F:
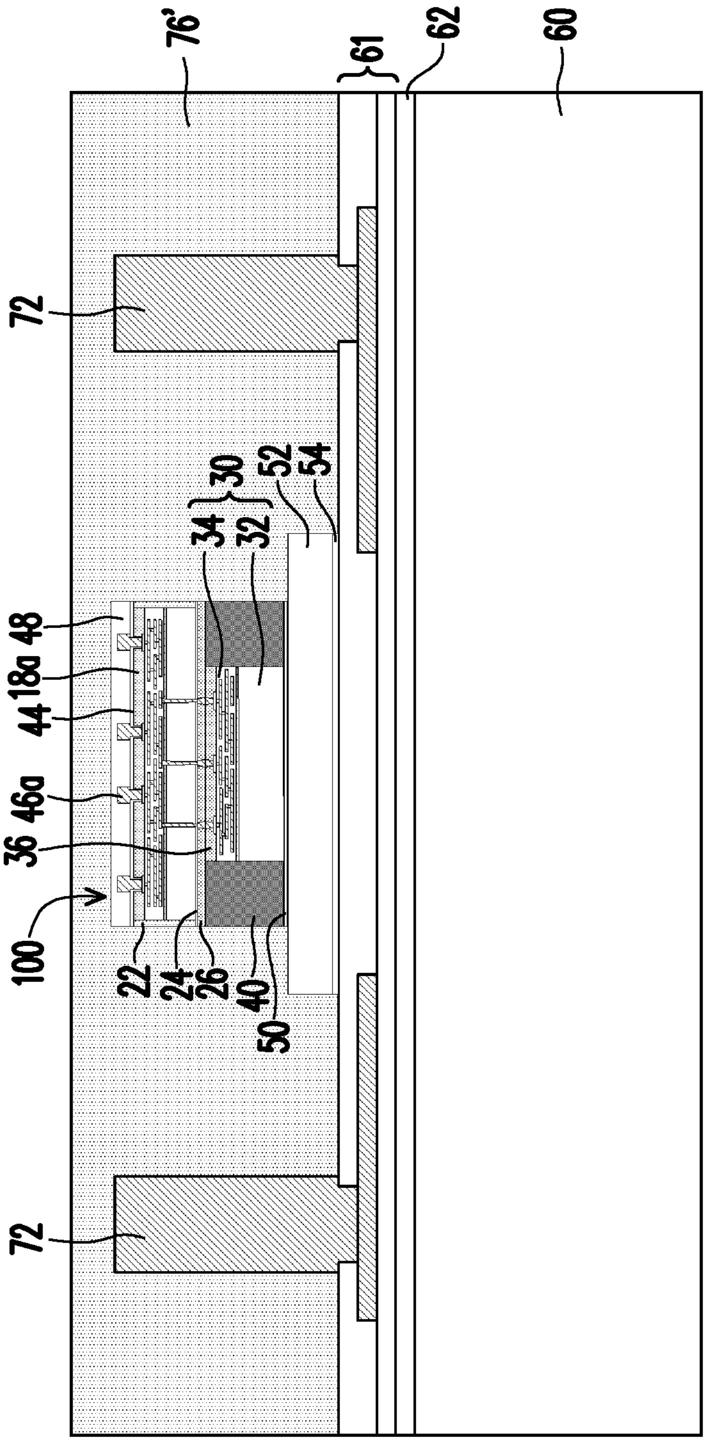

Referring to FIG. 2F, an insulating encapsulation material 76 is formed over the redistribution circuit structure 61 to cover the thermal enhance component 52, the chip stacking structure 100 and the conductive through vias 72. The insulating encapsulation material 76 may be a molding compound (e.g., epoxy or other suitable resin) formed through an over-molding process. The insulating encapsulation material 76 not only fills the gaps between neighboring conductive through vias 72, but also fills the gaps between the conductive through vias 72 and the thermal enhance component 52 as well as the gaps between the conductive through vias 72 and the chip stacking structure 100. The insulating encapsulation material 76 covers the top surface of the dielectric layer 48 of the chip stacking structure 100.

Figure 2G:
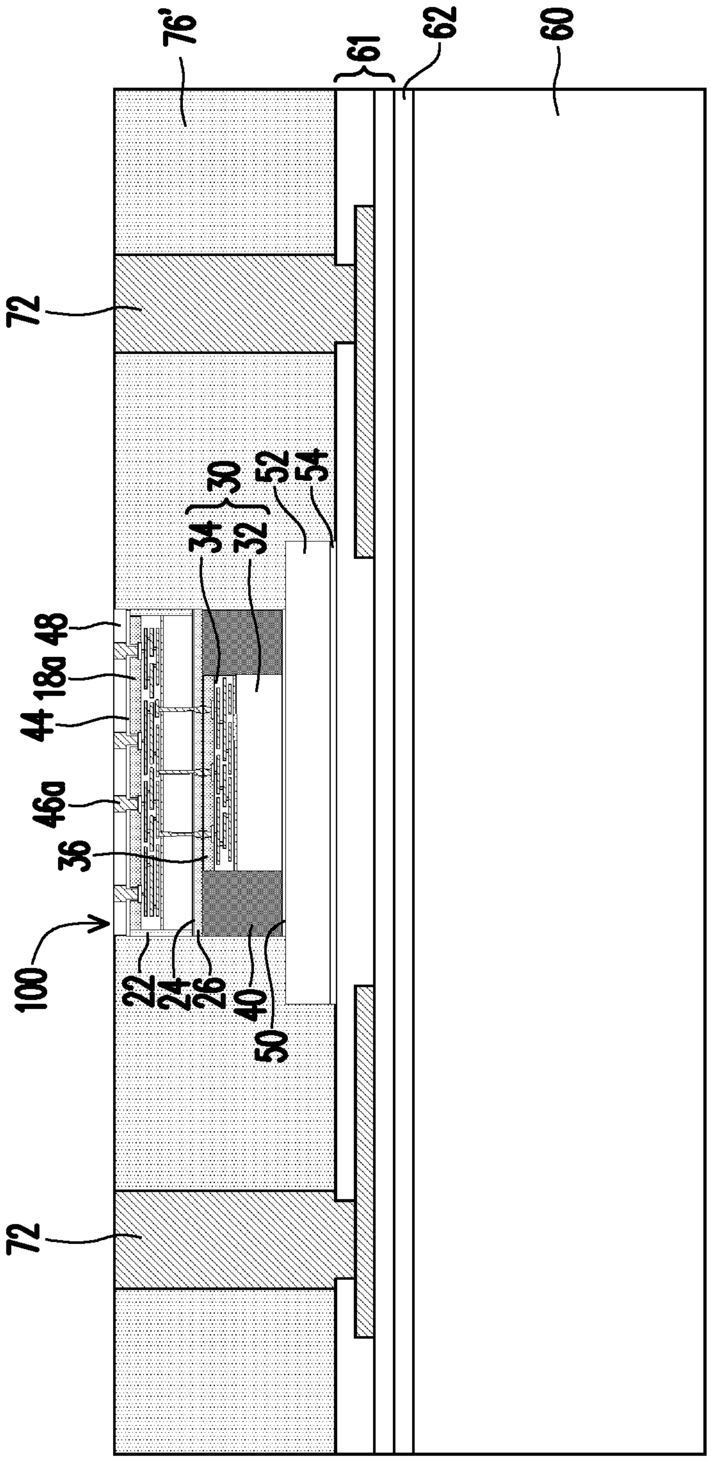

Next, as shown in FIG. 2G, a planarization such as a Chemical Mechanical Polish (CMP) process and/or a mechanical grinding process is performed to partially remove the insulating encapsulation material 76 and the dielectric layer 48 of the chip stacking structure 100 until the conductive through vias 72 and the conductive pillars **46*a* of the chip stacking structure 100 are revealed. After the insulating encapsulation material 76 is thinned, as illustrated in FIG. 2G, an insulating encapsulant 76' is formed to laterally encapsulate the thermal enhance component 52, the chip stacking structure 100 and the conductive through vias 72. Due to the planarization, the conductive through vias 72 penetrate though the insulating encapsulant 76', the top ends of the conductive through vias 72 are substantially level or coplanar with the top surface of the dielectric layer 48, and are substantially level or coplanar with the top surface of the insulating encapsulant 76', within process variations. In the illustrated exemplary embodiments, the planarization is performed until the conductive through vias 72 and the conductive pillars 46***a* of the chip stacking structure 100 are revealed.

Figure 2H:
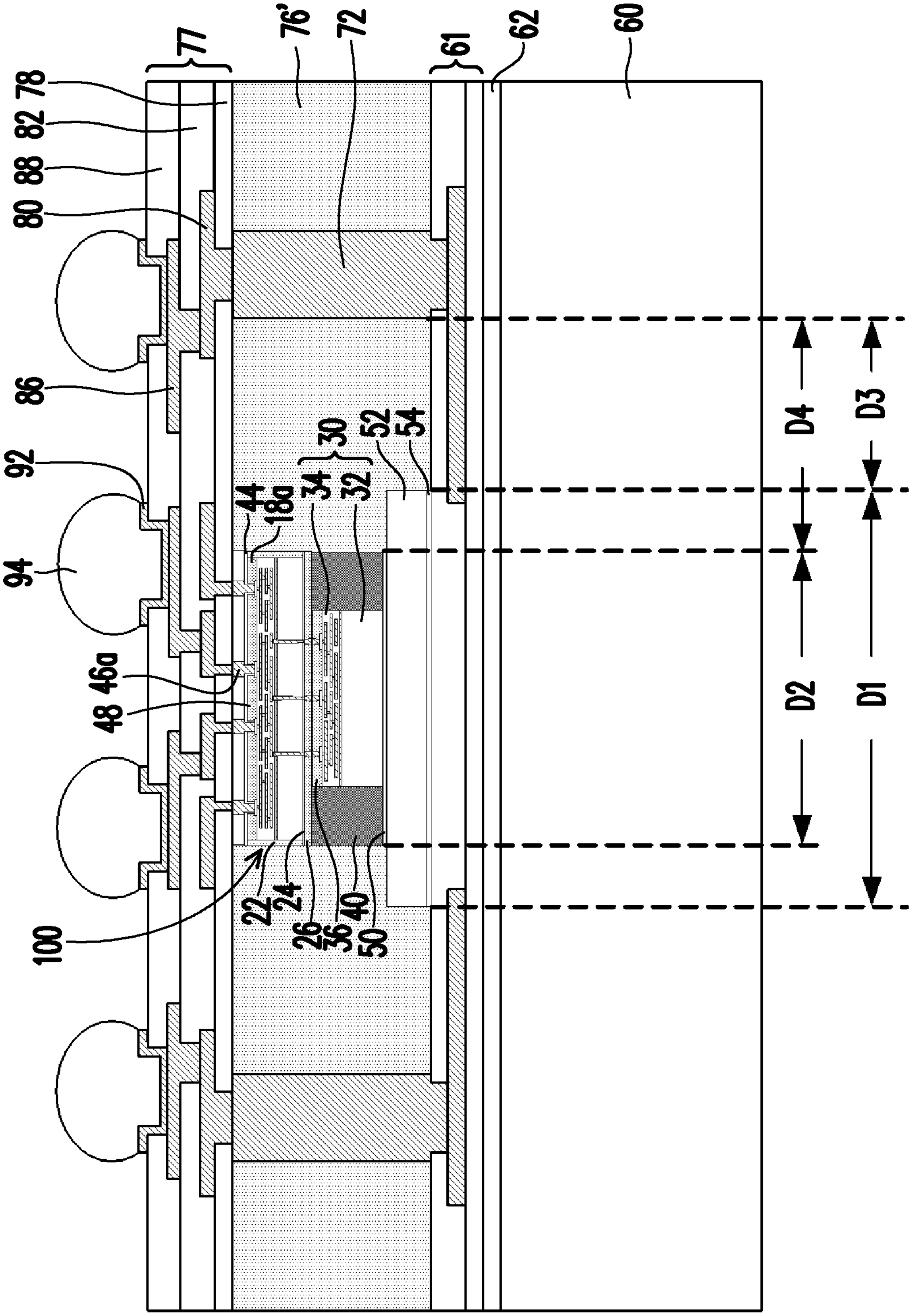

Referring to FIG. 2H, a redistribution circuit structure 77 including a dielectric layer 78, redistribution wirings 80, a dielectric layer 82, redistribution wirings 86, and a dielectric layer 88 is formed on the chip stacking structure 100 and the insulating encapsulant 76'. After forming the redistribution circuit structure 77, solder regions including Under-Bump Metallurgies (UBMs) 92 and electrical connectors 94 disposed on the UBMs 92 are formed on the redistribution circuit structure 77.

The dielectric layer 78 is formed to cover the dielectric 48, the conductive pillars 46*a* and the insulating encapsulant 76'. In some embodiments, the dielectric layer 78 is formed of a polymer such as PBO, polyimide, or the like. In some other embodiments, dielectric layer 78 is formed of silicon nitride, silicon oxide, or the like. Openings may be formed in the dielectric layer 78 to expose conductive through vias 72 and the conductive pillars 46*a*. The formation of the openings in the dielectric layer 78 may be performed through a photolithography process.

Next, the redistribution wirings 80 are formed to connect to the conductive pillars 46*a* and the conductive through vias 72. The redistribution wirings 80 may also interconnect the conductive pillars 46*a* and the conductive through vias 72. The redistribution wirings 80 may include metal traces (metal lines) over the dielectric layer 78 as well as metal vias extending into the openings defined in the dielectric layer 78 so as to electrically connect to the conductive through vias 72 and the conductive pillars 46*a*. In some embodiments, the redistribution wirings 80 are formed by a plating process, wherein each of the redistribution wirings 80 includes a seed layer (not shown) and a plated metallic material over the seed layer. The seed layer and the plated material may be formed of the same material or different materials. The redistribution wirings 80 may include a metal or a metal alloy including aluminum, copper, tungsten, and alloys thereof. The redistribution wirings 80 may be formed of non-solder materials. The via portions of the redistribution wirings 80 may be in physical contact with the top surfaces of the conductive through vias 72 and the conductive pillars 46*a*.

The dielectric layer 82 is then formed over the redistribution wirings 80 and the dielectric layer 78. The dielectric layer 82 may be formed using a polymer, which may be selected from the same candidate materials as those of the dielectric layer 78. For example, the dielectric layer 82 may include PBO, polyimide, BCB, or the like. In some embodiments, the dielectric layer 82 may include non-organic dielectric materials such as silicon oxide, silicon nitride, silicon carbide, silicon oxynitride, or the like. Openings may be also formed in the dielectric layer 82 to expose the redistribution wirings 80. The formation of the openings defined in the dielectric layer 82 may be performed through a photolithography process. The formation of the redistribution wirings 86 may adopt similar methods and materials to those for forming the redistribution wirings 80.

The dielectric layer 88, which may be a polymer layer, may be formed to cover the redistribution wirings 86 and the dielectric layer 82. The dielectric layer 88 may be selected from the same candidate polymers used for forming the dielectric layers 78 and 82. Openings may be formed in the dielectric layer 88 to expose the metal pad portions of redistribution wirings 86. The formation of the openings defined in the dielectric layer 88 may be performed through a photolithography process.

The formation of the UBMs 92 may include deposition and patterning. The formation of the electrical connectors 94 may include placing solder on the exposed portions of the UBMs 92 and then reflowing the solder to form solder balls. In some embodiments, the formation of the electrical connectors 94 includes performing a plating step to form solder regions over redistribution wirings 86 and then reflowing the solder regions. In some other embodiments, the electrical connectors 94 include metal pillars or metal pillars and solder caps, which may also be formed through plating. Throughout the description, the combined structure including the chip stacking structure 100, the conductive through vias 72, the insulating encapsulant 76', the redistribution circuit structure 61, the redistribution circuit structure 77, the UBMs 92 and the electrical connectors 94 will be referred to as a wafer level package, which may be a composite wafer with a round top-view shape.

Figure 2I:
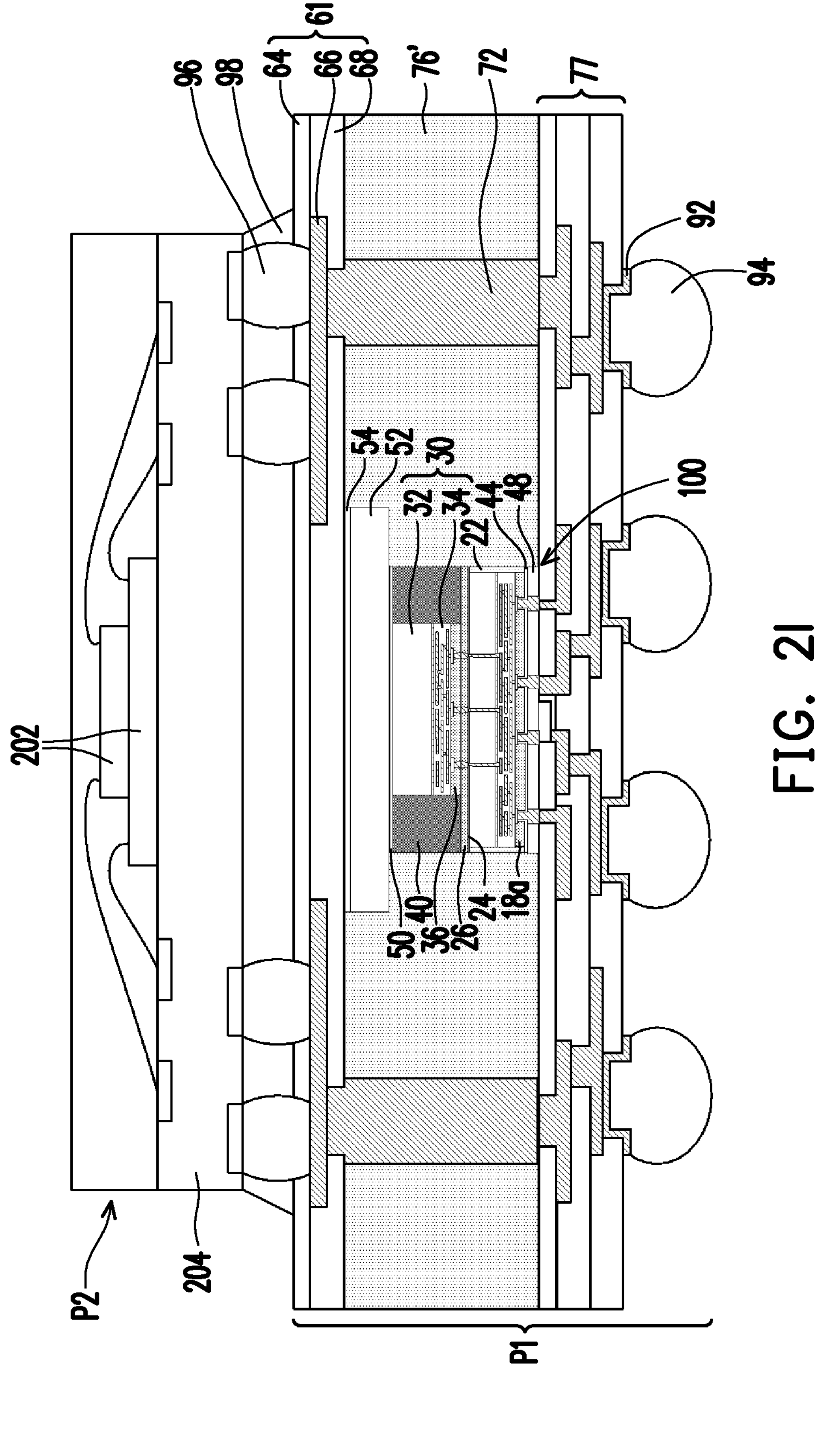

Referring to FIG. 2H and FIG. 2I, a de-bonding process is then performed such that the carrier 60 is de-bonded from the wafer level package. After performing the de-bonding process, the dielectric layer 64 of the redistribution circuit structure 61 are revealed. During the de-bonding process, the de-bonding layer 62 is also cleaned from the wafer level package. The de-bonding may be performed by irradiating a light such as UV light or laser on the de-bonding layer 62 to decompose the de-bonding layer 62. In the de-bonding process, a tape (not shown) may be adhered onto the dielectric layer 88 and the electrical connectors 94. In subsequent steps, the carrier 60 and the de-bonding layer 62 are removed from the wafer level package. A singulation process is performed to saw the wafer level package illustrated in FIG. 2H into multiple singulated integrated fanout packages P1 illustrated in FIG. 2I.

A patterning process is performed to form openings in the dielectric layer 64 to expose the redistribution wirings 66. The formation of the openings defined in the dielectric layer 64 may be performed through a photolithography process. Then, a top package P2 is provided and bonded with the integrated fanout package P1 (i.e., the bottom package) such that a PoP structure is formed. In some embodiments of the present disclosure, the bonding between the top package P2 and the integrated fanout package P1 is performed through electrical connectors (e.g., solder regions) 96, which joins the metal pad portions of the redistribution wirings 66 to the metal pads in the top package P2. An underfill 98 may be formed to fill the gap between the top package P2 and the integrated fanout package P1 such that the electrical connectors 96 are laterally encapsulated by the underfill 98 and reliability of the electrical connectors 96 can be enhanced. In some embodiments, the top package P2 includes semiconductor dies 202, which may be memory dies such as Static Random Access Memory (SRAM) dies, Dynamic Random Access Memory (DRAM) dies, or the like. The memory dies may also be bonded to package substrate 204 in some exemplary embodiments.

As illustrated in FIG. 2I, the integrated fanout package P1 includes a chip stacking structure 100 (e.g., an SoIC structure), a thermal enhance component 52 (e.g., a heat sink), and an insulating encapsulant 76'. The chip stacking structure 100 may include a semiconductor die 20 (i.e., a bottom tier semiconductor die), an insulating encapsulant 22, a semiconductor die 30 (i.e., a top tier semiconductor die) and an insulating encapsulant 40. The semiconductor die 30 is disposed between the semiconductor die 20 and the thermal enhance component 52, and the semiconductor die 20 is laterally encapsulated by the insulating encapsulant 22. The insulating encapsulant 22 and the insulating encapsulant 40 are respectively in contact with the insulating encapsulant 76'. The semiconductor die 30 is stacked over and electrically connected to the semiconductor die 20. The insulating encapsulant 40 is disposed over the semiconductor die 20 and laterally encapsulates the semiconductor die 30. The thermal enhance component 52 is stacked over and thermally coupled to the chip stacking structure 100, and a lateral dimension D1 of the thermal enhance component 52 is greater than a lateral dimension D2 of the chip stacking structure 100. For example, the lateral dimension D1 of the thermal enhance component 52 ranges from about 6 mm to about 11 mm, the lateral dimension D2 of the chip stacking structure 100 ranges from about 6 mm to about 9 mm, the ratio of the first lateral dimension D1 to the second lateral dimension D2 (i.e., D1/D2) ranges from about 1 to about 1. The chip stacking structure 100 and the thermal enhance component 52 are laterally encapsulated by the insulating encapsulant 76'. In other words, the thermal enhance component 52 and the chip stacking structure 100 are embedded in the insulating encapsulant 76'. In some embodiments, the integrated fanout package P1 may further include conductive through vias 72 laterally encapsulated by the insulating encapsulant 76', a redistribution circuit structure 61 and a redistribution circuit structure 77, wherein the redistribution circuit structure 61 and the redistribution circuit structure 77 are respectively disposed on opposite sides of the insulating encapsulant 76'. The minimum lateral distance D3 between the conductive through vias 72 and the thermal enhance component 52 is smaller than the minimum lateral distance D4 between the conductive through vias 72 and the chip stacking structure 100. For example, the minimum lateral distance D3 is greater than 0.2 mm.

Figure 3A:
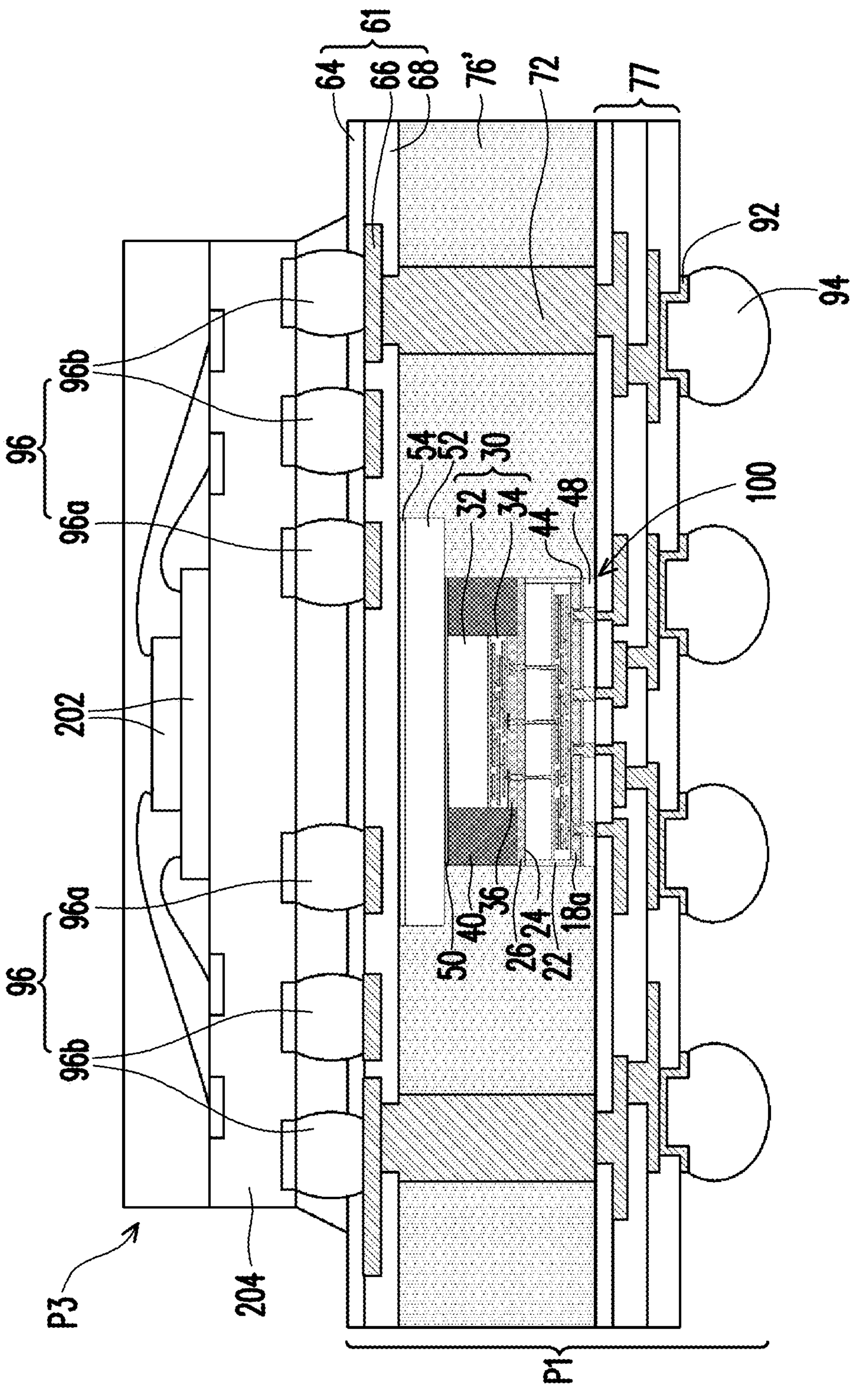
FIG. 3A and FIG. 3B are cross-sectional views schematically illustrating PoP structures in accordance with some other embodiments of the present disclosure.
Figure 3B:
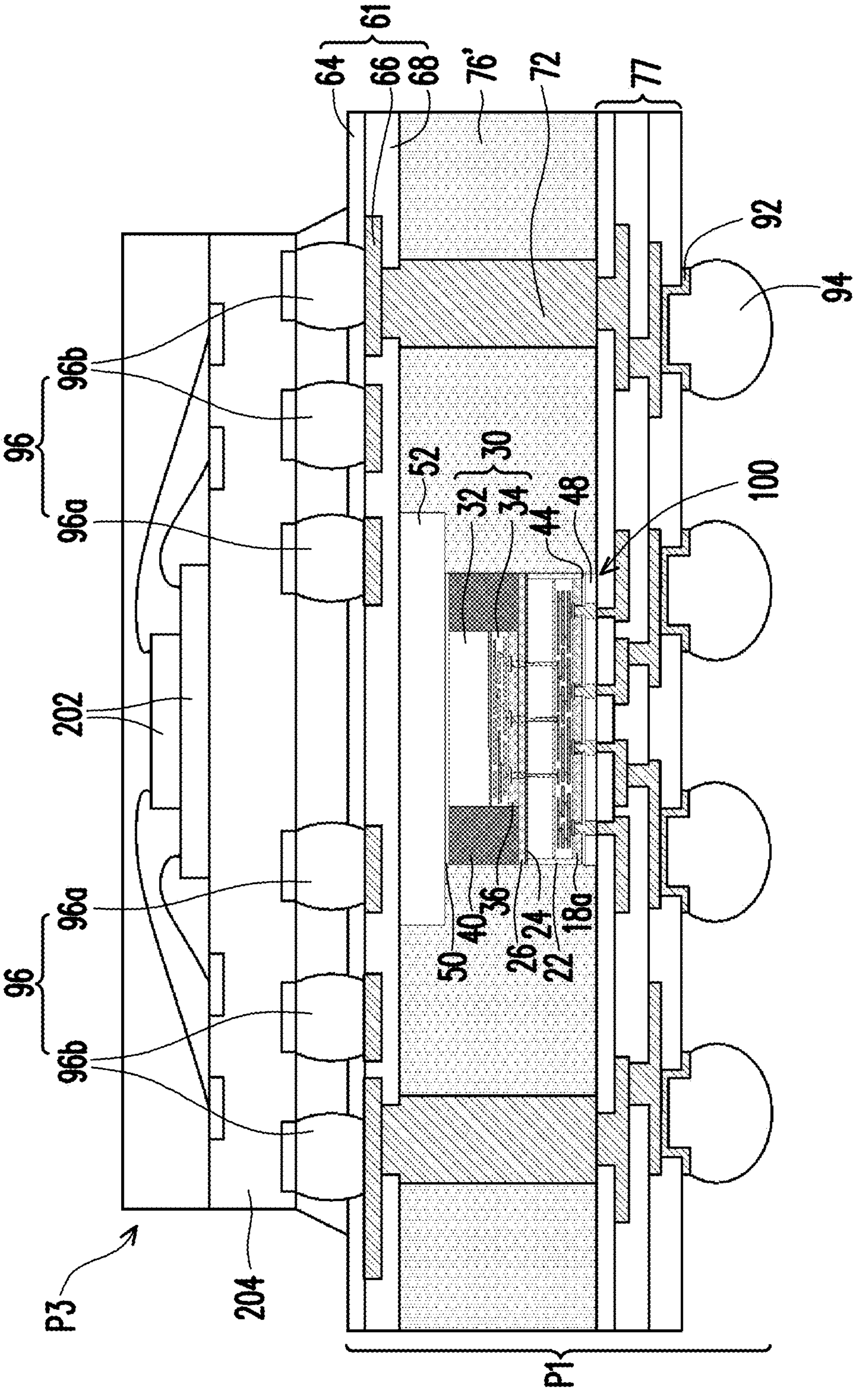

FIG. 3A and FIG. 3B are cross-sectional views schematically illustrating PoP structures in accordance with some other embodiments of the present disclosure.

Referring to FIG. 2I and FIG. 3A, the PoP structure illustrated in FIG. 3A is similar with the PoP structure illustrated in FIG. 2I except that the distribution of electrical connectors 96 of the top package P3 and the redistribution wirings 66 in the redistribution circuit structure 61. As illustrated in FIG. 3A, at least one first electrical connectors 96*a* among the electrical connectors 96 is located above the thermal enhance component 52, and multiple second electrical connectors 96*b* among the electrical connectors 96 electrically connected to the redistribution circuit structure 61, and the second electrical connectors 96*b* are not located above the thermal enhance component 52. In some embodiments, the first electrical connector 96*a* is laterally surrounded by the second electrical connectors 96*b*.

FIGS. 4A through 4L are cross-sectional views schematically illustrating a process flow for fabricating chip stacking structures in accordance with some other embodiments of the present disclosure.

Figure 4A:
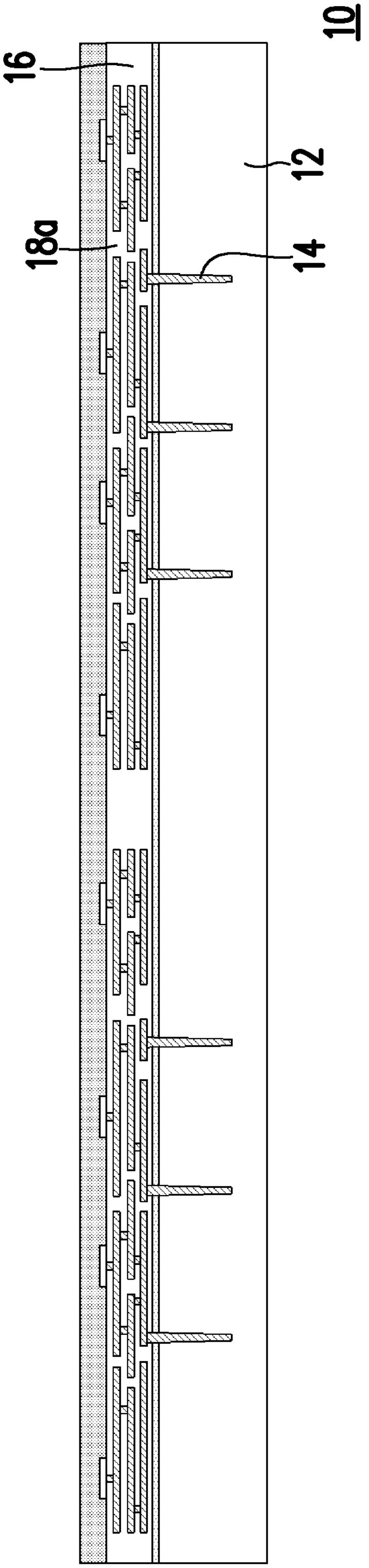
FIGS. 4A through 4L are cross-sectional views schematically illustrating a process flow for fabricating chip stacking structures in accordance with some other embodiments of the present disclosure.

Referring to FIG. 4A, a wafer 10 including semiconductor dies is provided. Since the process illustrated in FIG. 4A is the same as that illustrated in FIG. 1A, detailed descriptions regarding to the process illustrated in FIG. 4A are thus omitted.

Figure 4B:
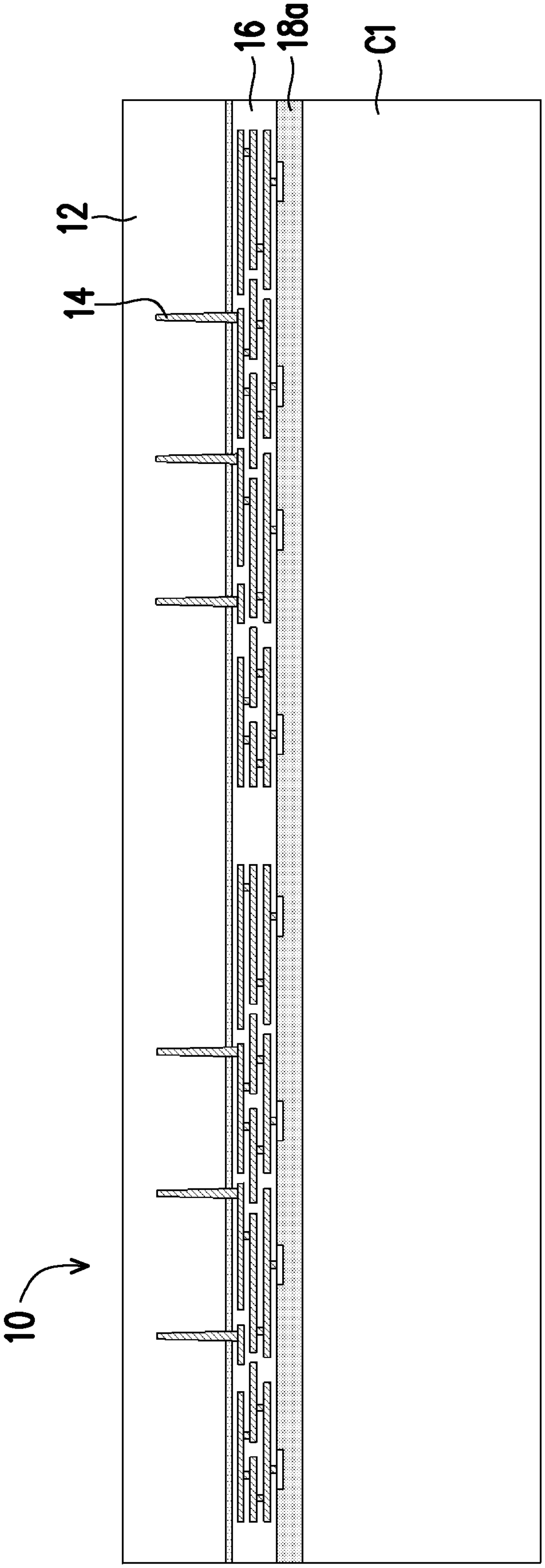

Referring to FIG. 4B, the wafer 10 is picked-up and placed on and bonded to a carrier C1. The carrier C1 may be a semiconductor wafer such as a silicon wafer. The carrier C1 may have a round top-view shape and a size of a silicon wafer. For example, carrier C1 may have an 8-inch diameter, a 12-inch diameter, or the like. The wafer 10 is bonded to the carrier C1 through a wafer-to-wafer bonding process. A bonding process is performed to bond the bonding dielectric layers 18*a* of the wafer 10 with the carrier C1. The bonding process may be a direct bonding process. After performing the above-mentioned direct bonding process, a semiconductor-to-dielectric bonding interface such as silicon-to-nitride (Si—$SiN_x$) bonding interface may be formed between the bonding dielectric layer 18*a* and the carrier C1.

Figure 4C:
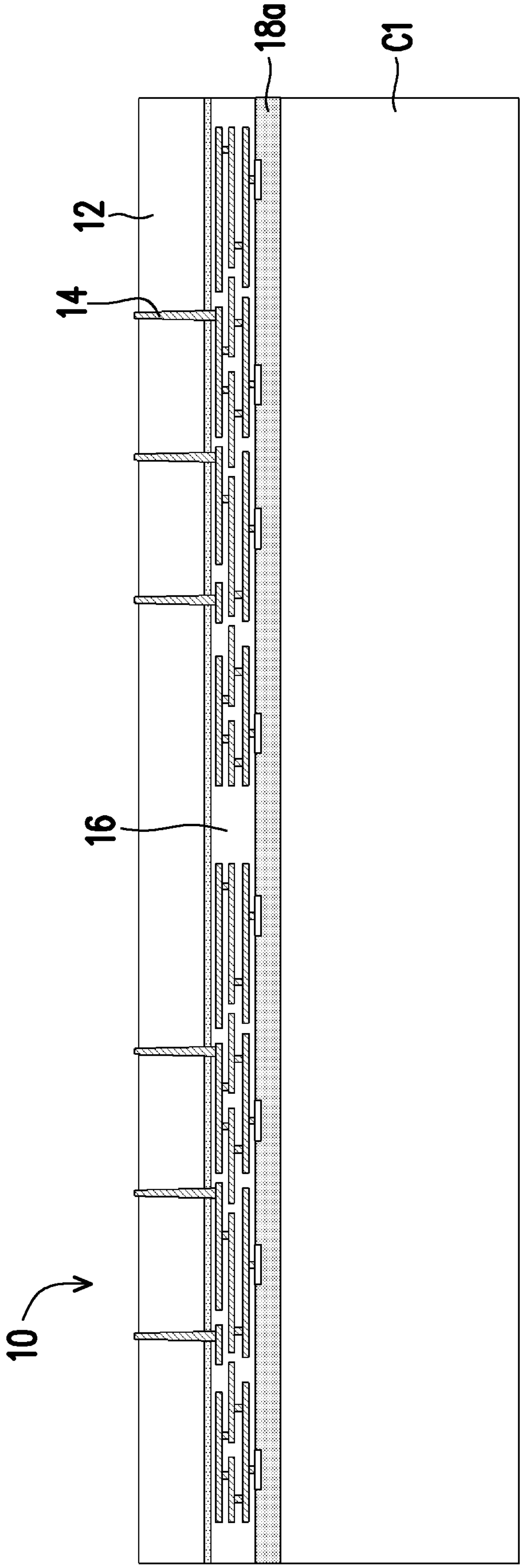
Figure 4D:
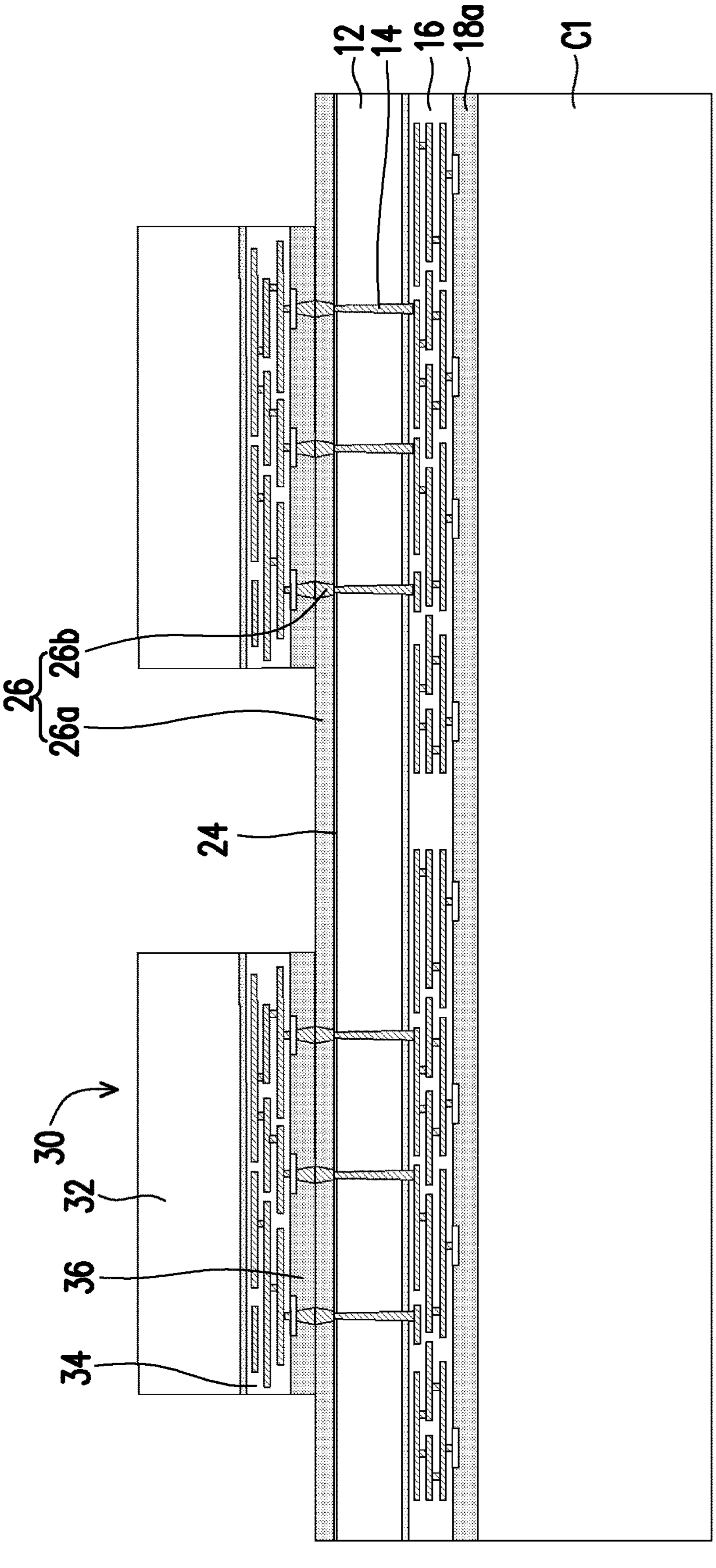
Figure 4E:
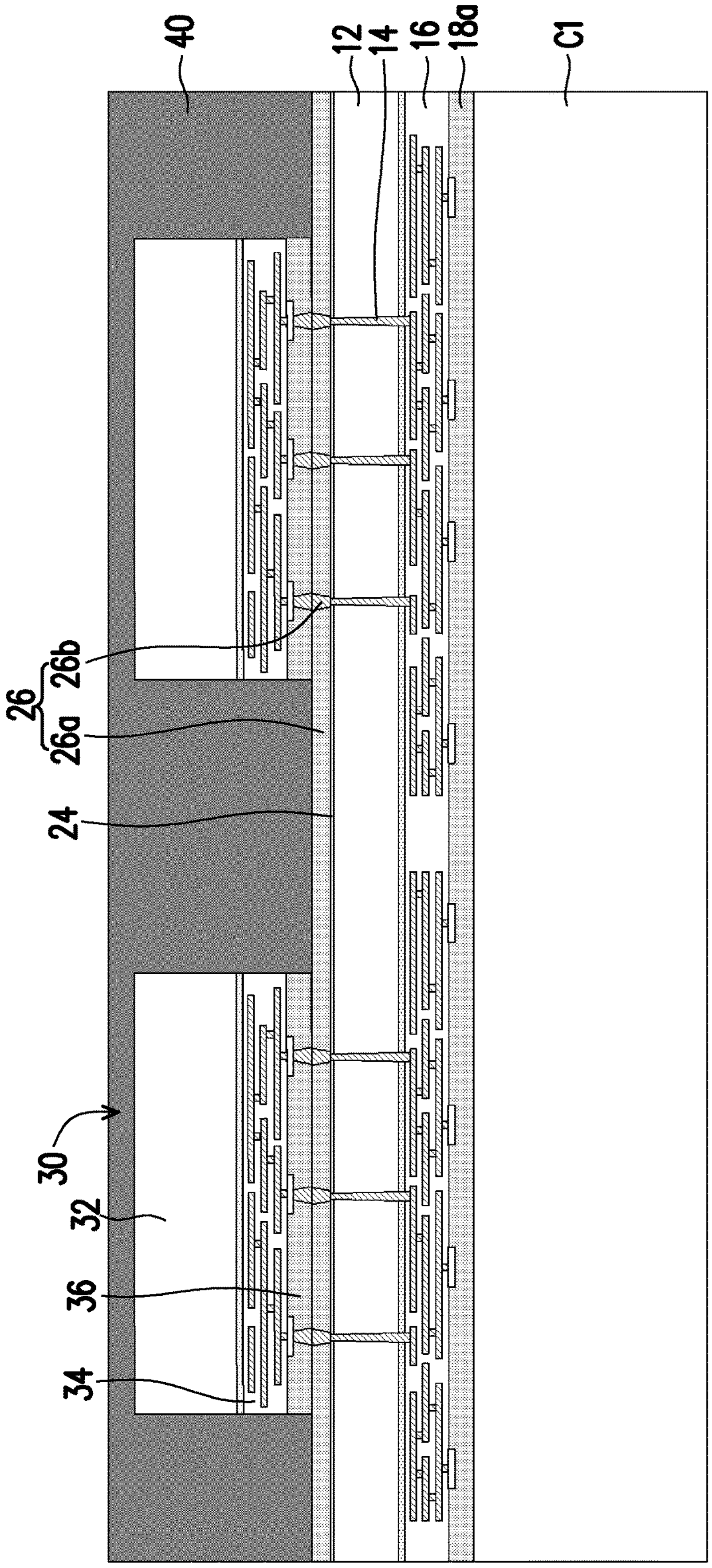
Figure 4F:
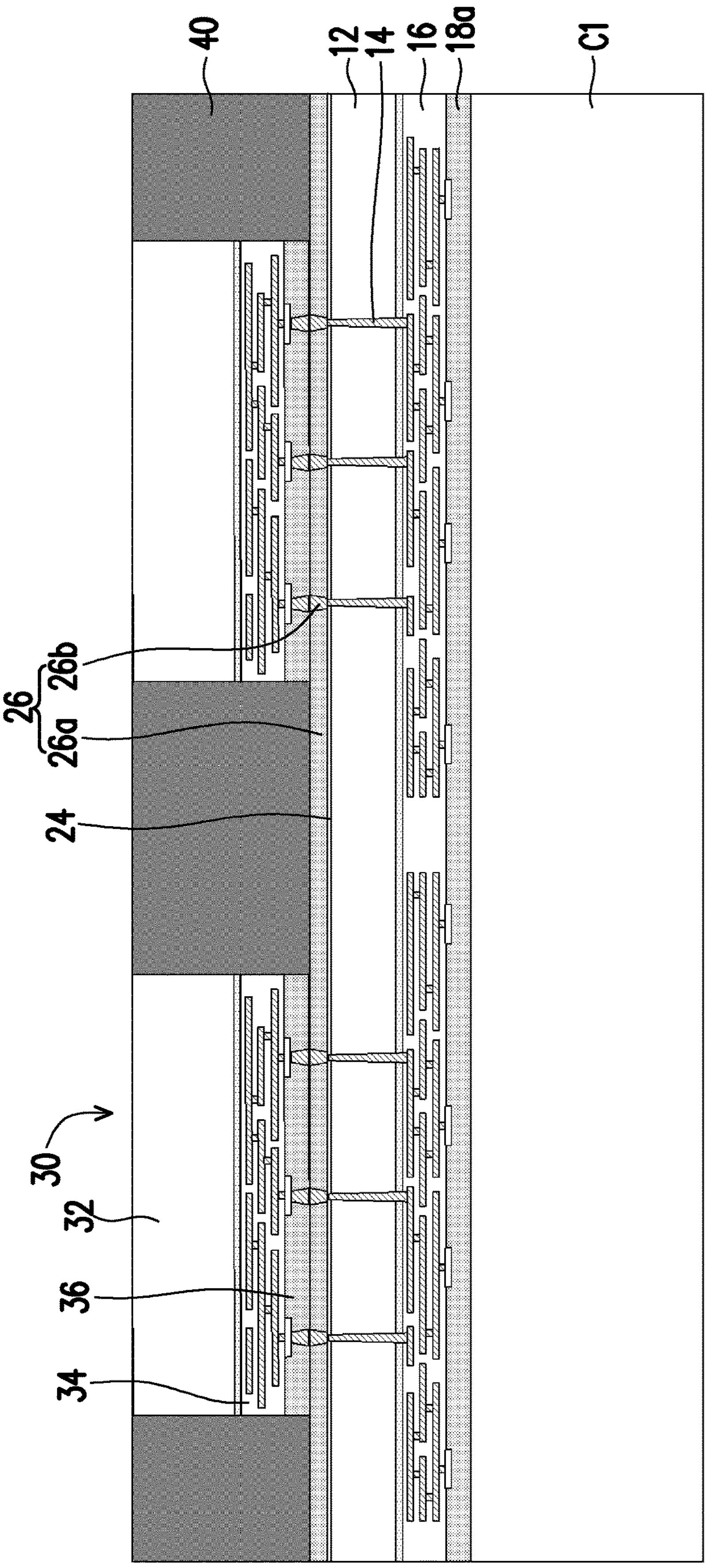
Figure 4G:
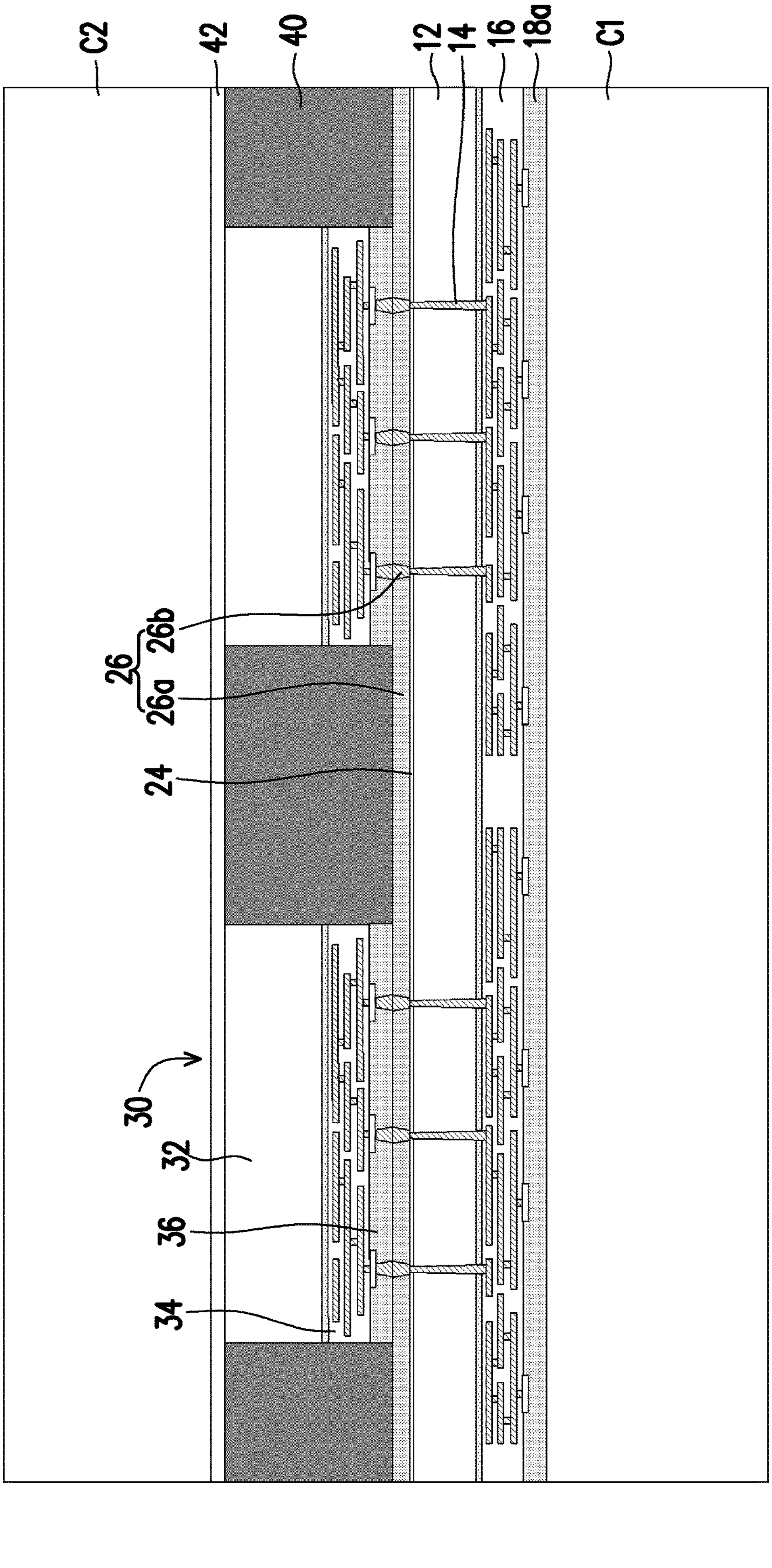
Figure 4H:
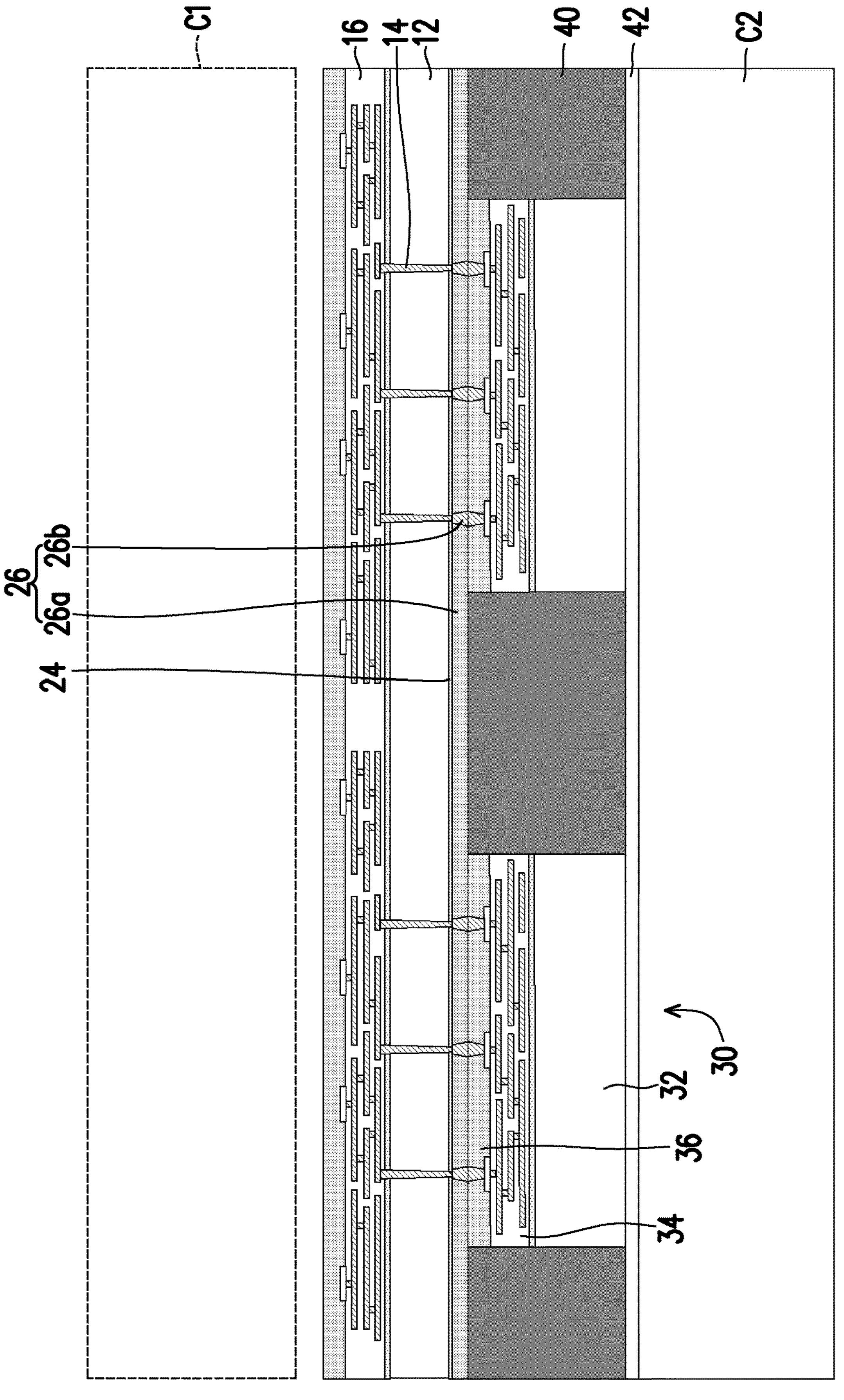
Figure 4I:
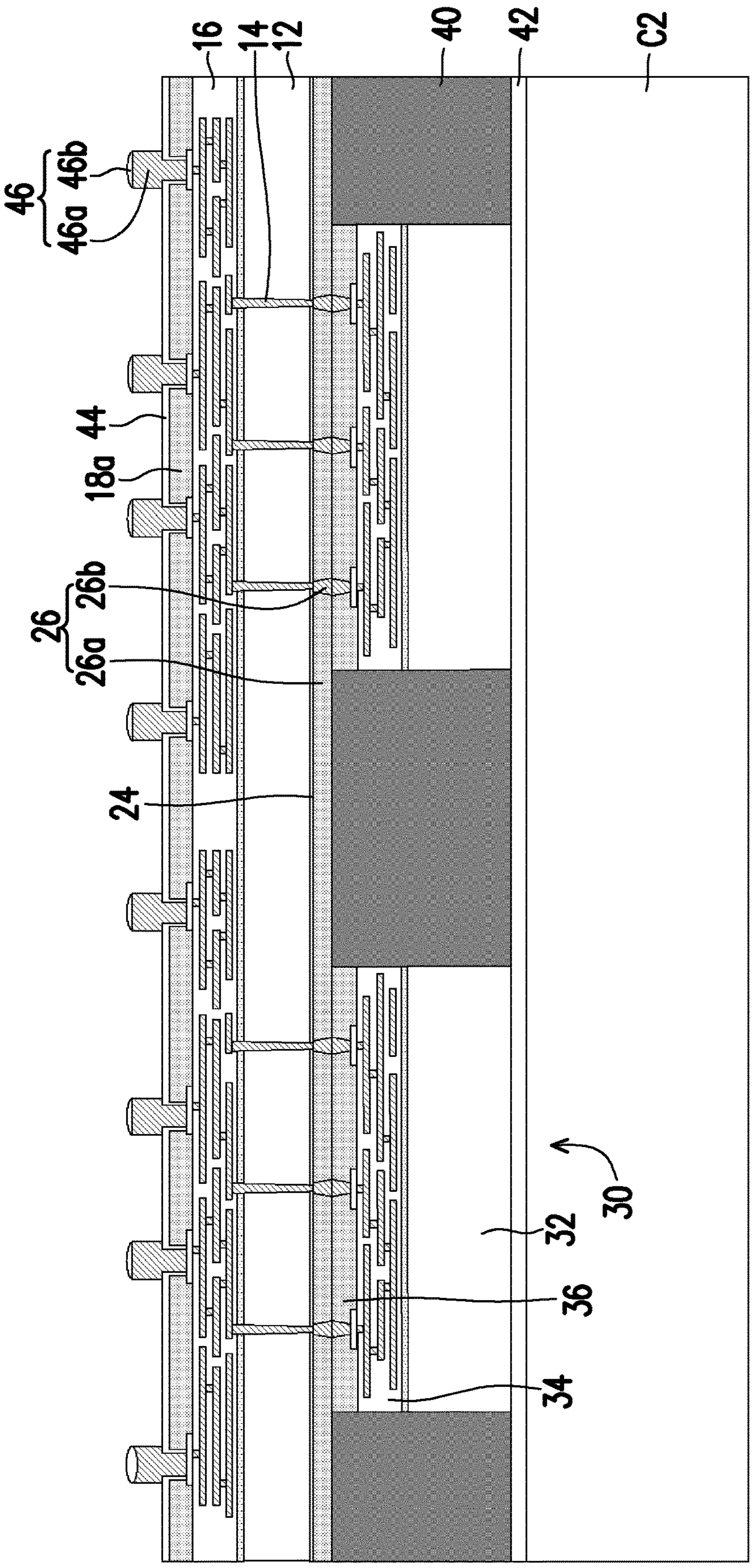
Figure 4J:
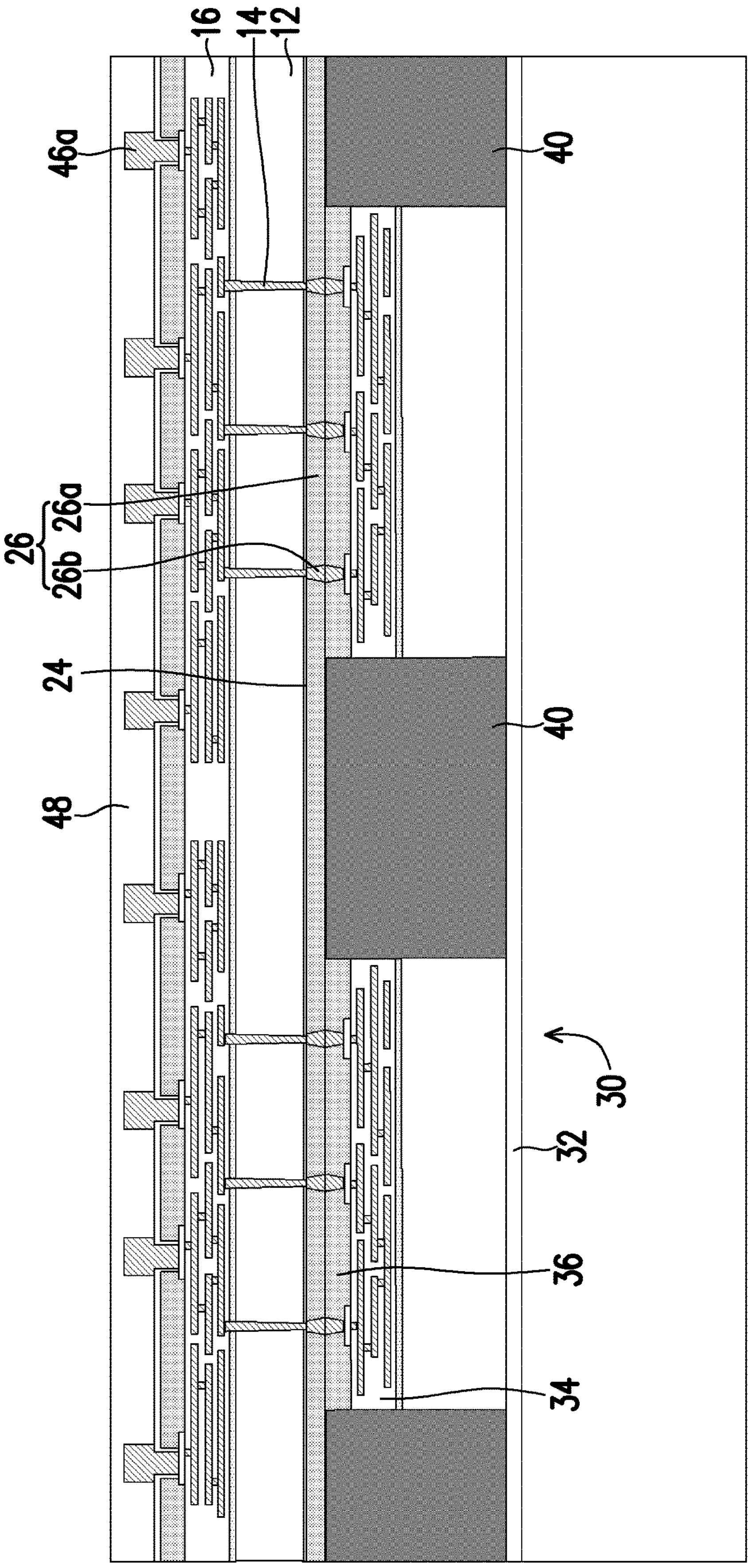
Figure 4K:
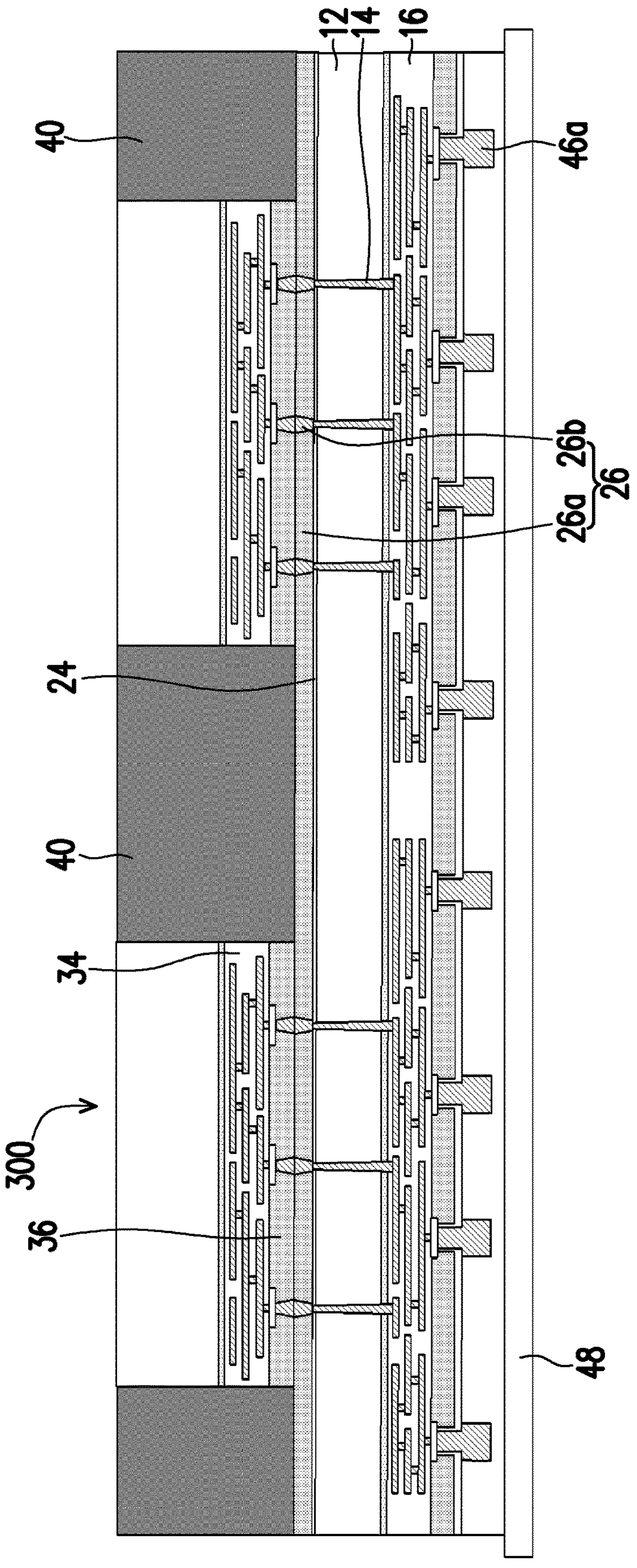
Figure 4L:
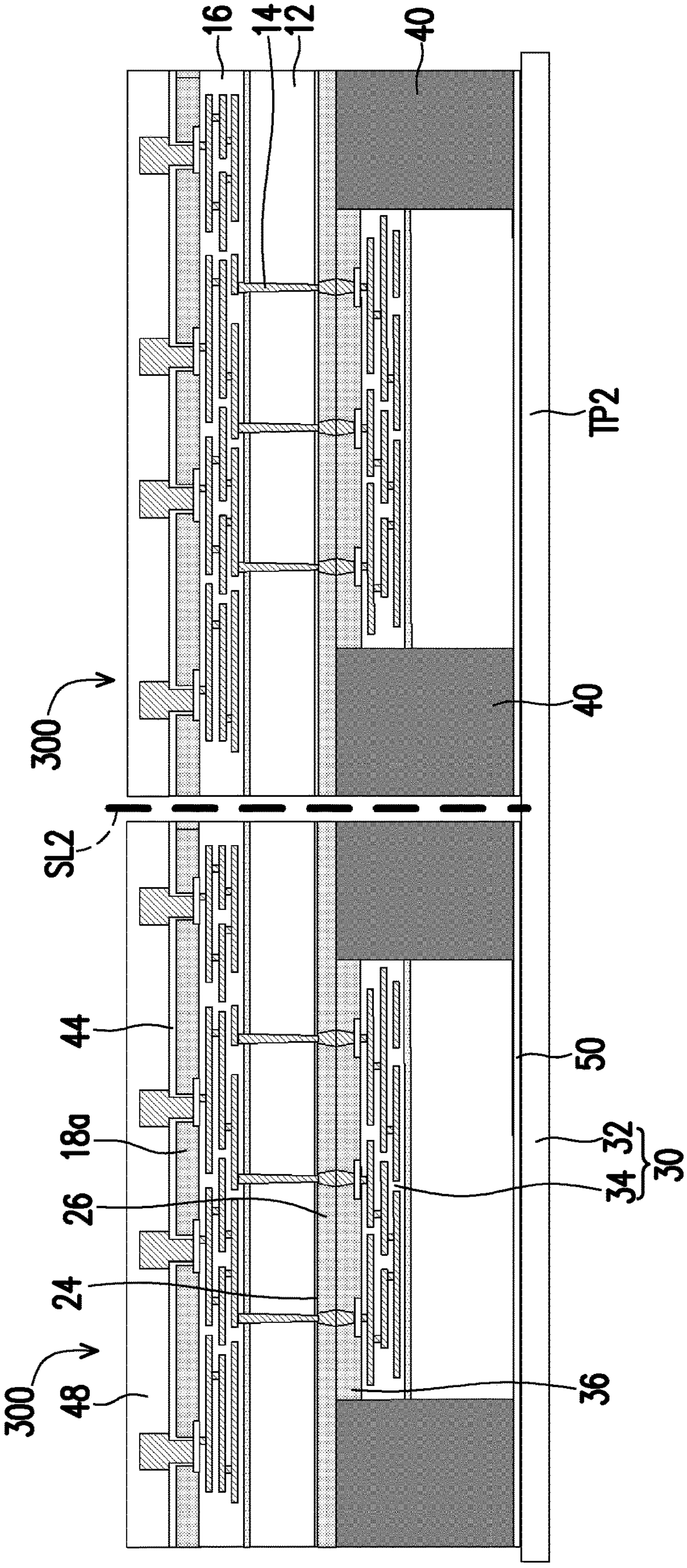

Referring to FIG. 4C, a thinning process is performed to partially remove the semiconductor substrate 12 of the wafer 10 until the through semiconductor vias 14 are revealed from the back surface of the semiconductor substrate 12. The thinning process may be a Chemical Mechanical Polish (CMP) process and/or a mechanical grinding process. After performing the above-mentioned thinning process, the through semiconductor vias 14 protrude from the back surface of the semiconductor substrate 12.

Referring to FIGS. 4D through 4L, since the processes illustrated in FIGS. 4D through 4L for fabricating chip stacking structure 300 are the same as those illustrated in FIGS. 1E through 1M, detailed descriptions regarding to the processes illustrated in FIGS. 4A through 4L are thus omitted.

FIGS. 5A through 5I are cross-sectional views schematically illustrating a process flow for fabricating a PoP structure in accordance with some alternative embodiments of the present disclosure.

Referring to FIGS. 5A through 5D, since the processes illustrated in FIGS. 5A through 5D are the same as those illustrated in FIGS. 2A through 2D, detailed descriptions regarding to the processes illustrated in FIGS. 5A through 5D are thus omitted.

Figure 5A:
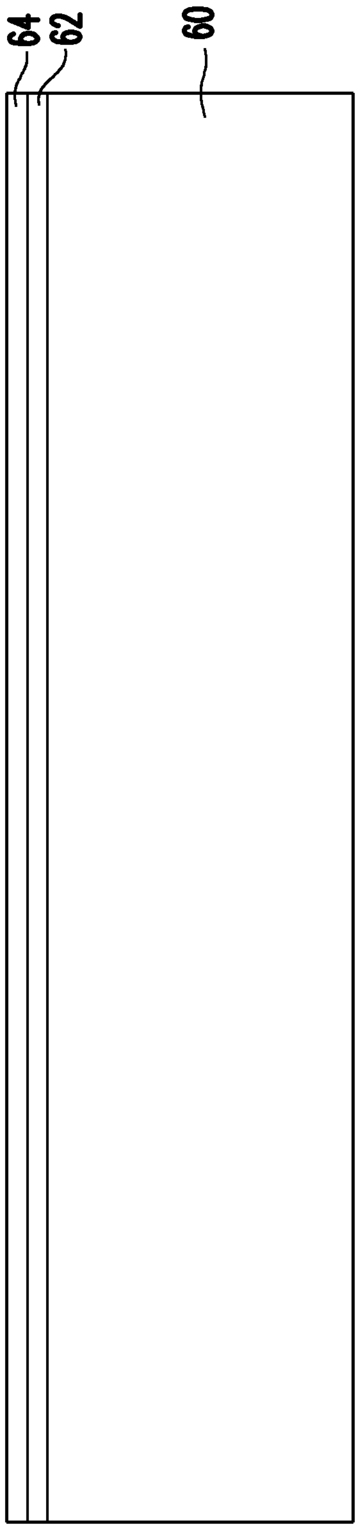
FIGS. 5A through 5I are cross-sectional views schematically illustrating a process flow for fabricating a PoP structure in accordance with some alternative embodiments of the present disclosure.
Figure 5B:
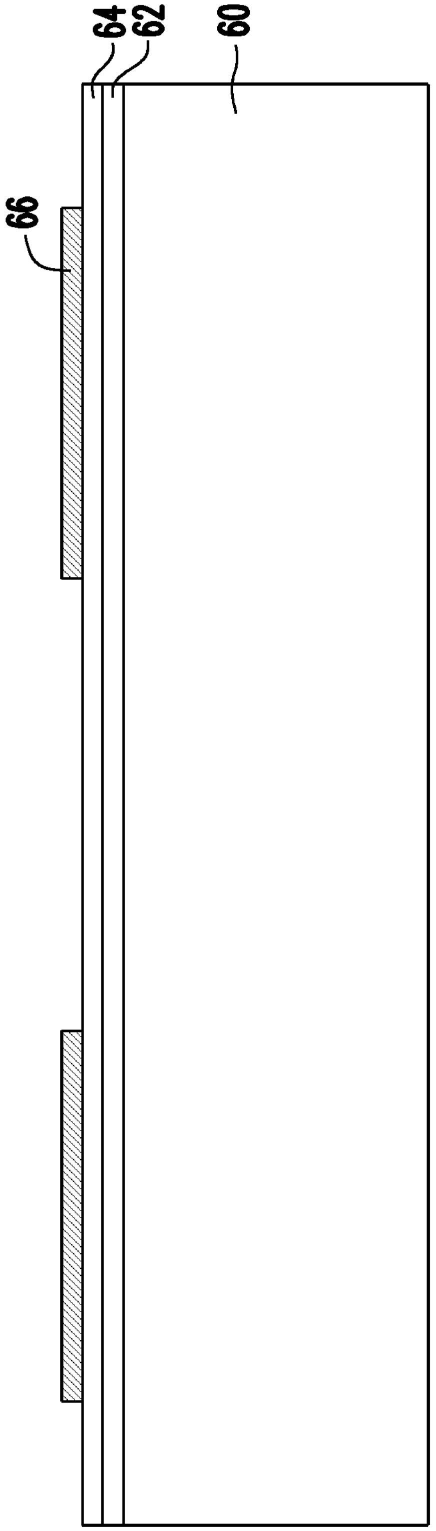
Figure 5C:
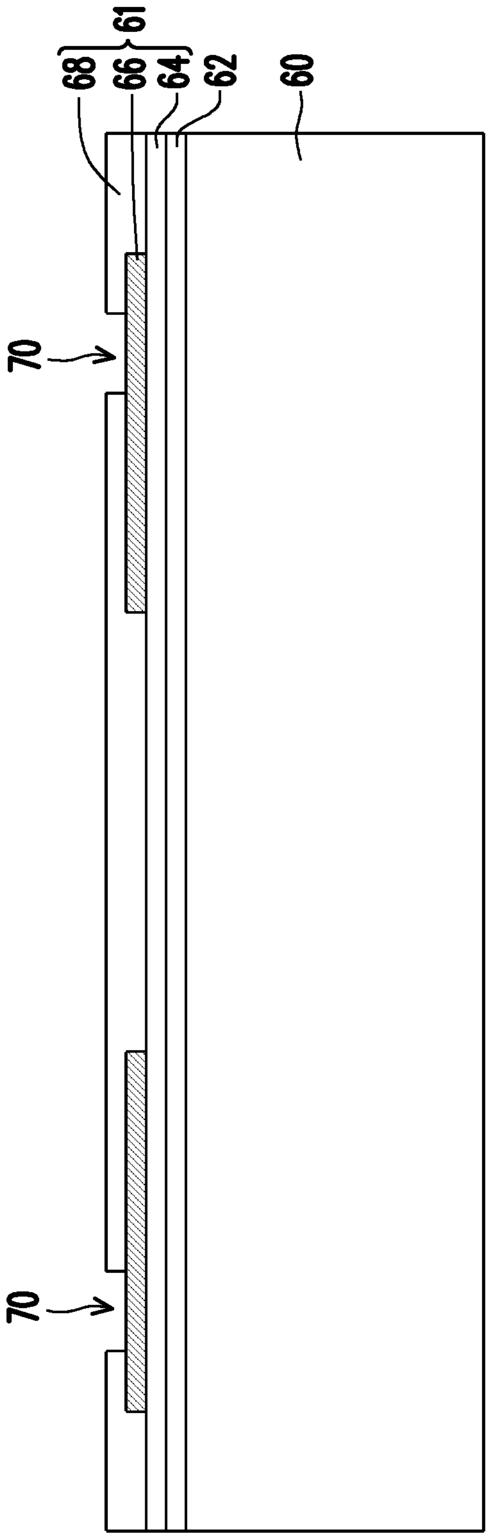
Figure 5D:
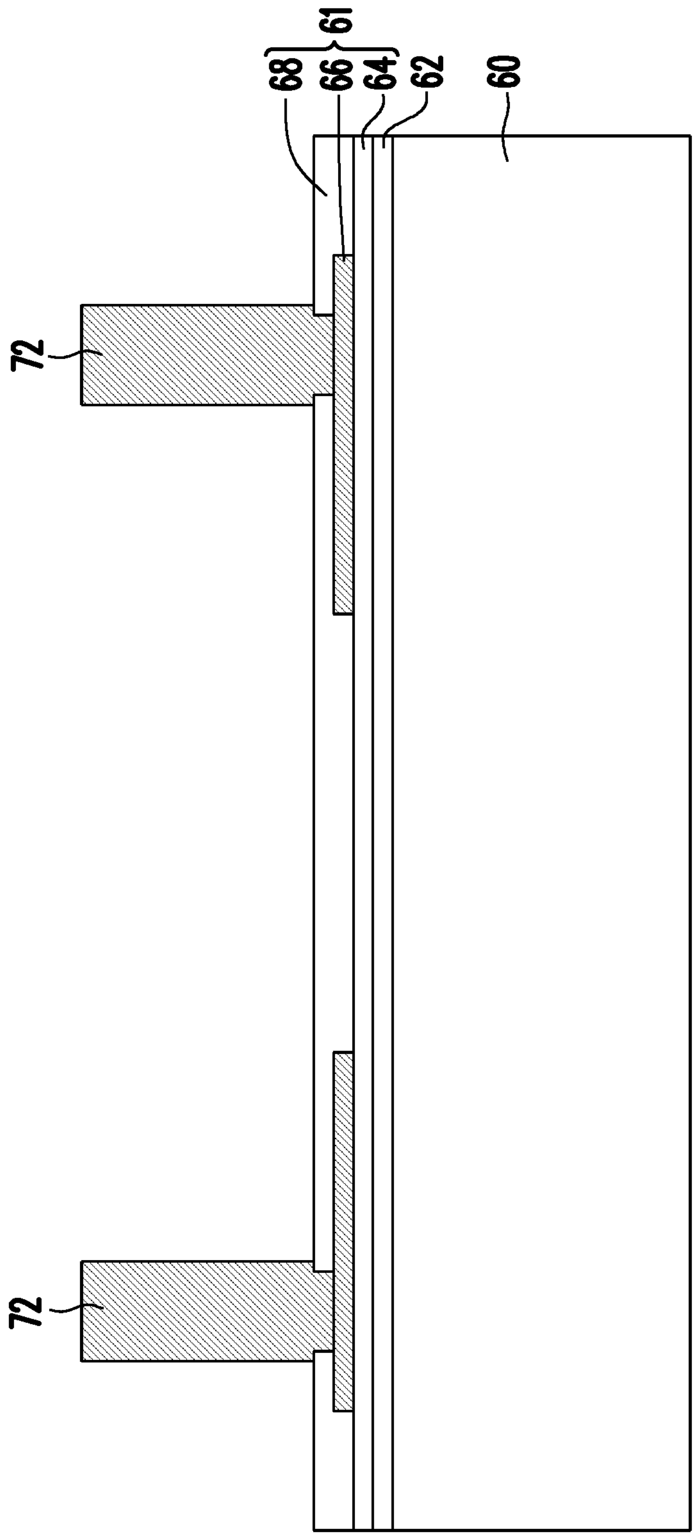
Figure 5E:
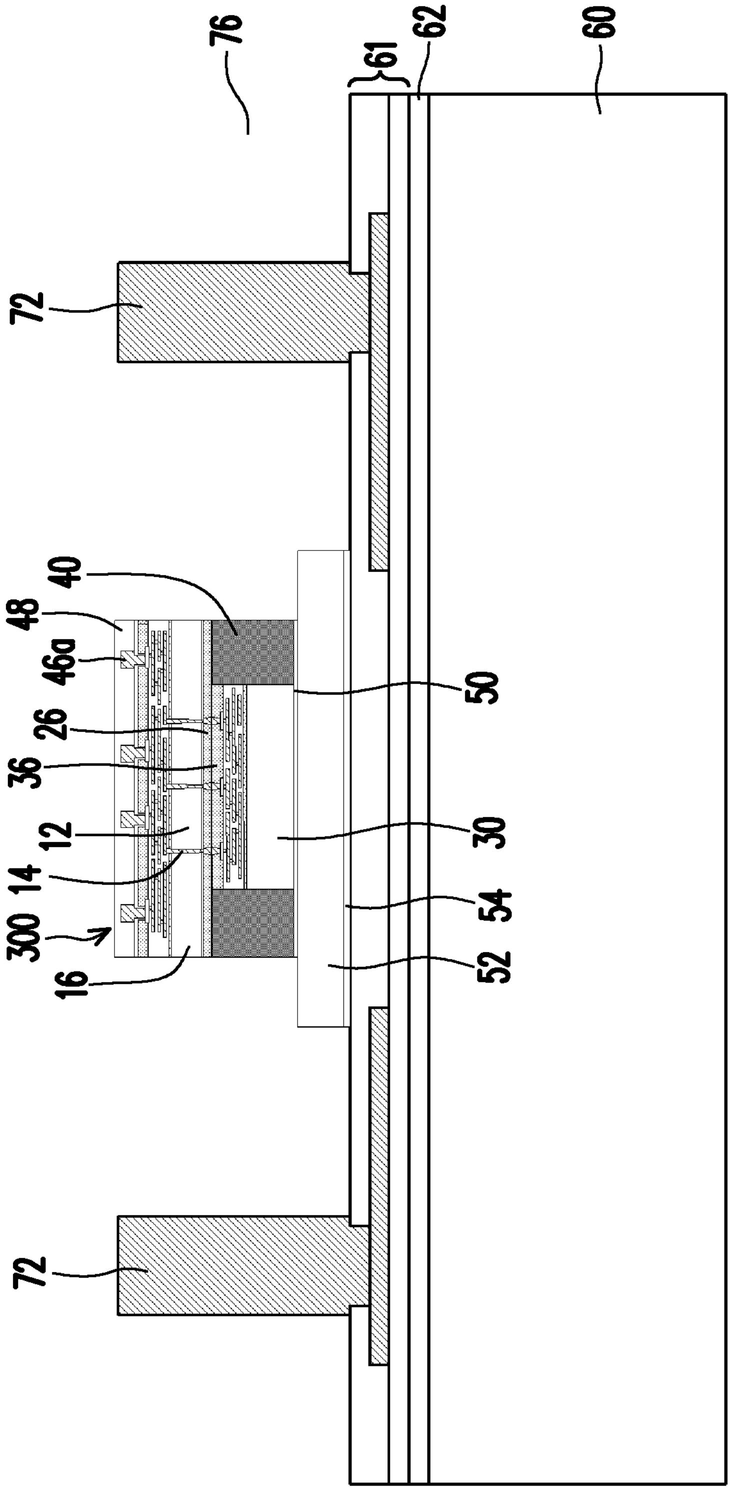
Figure 5F:
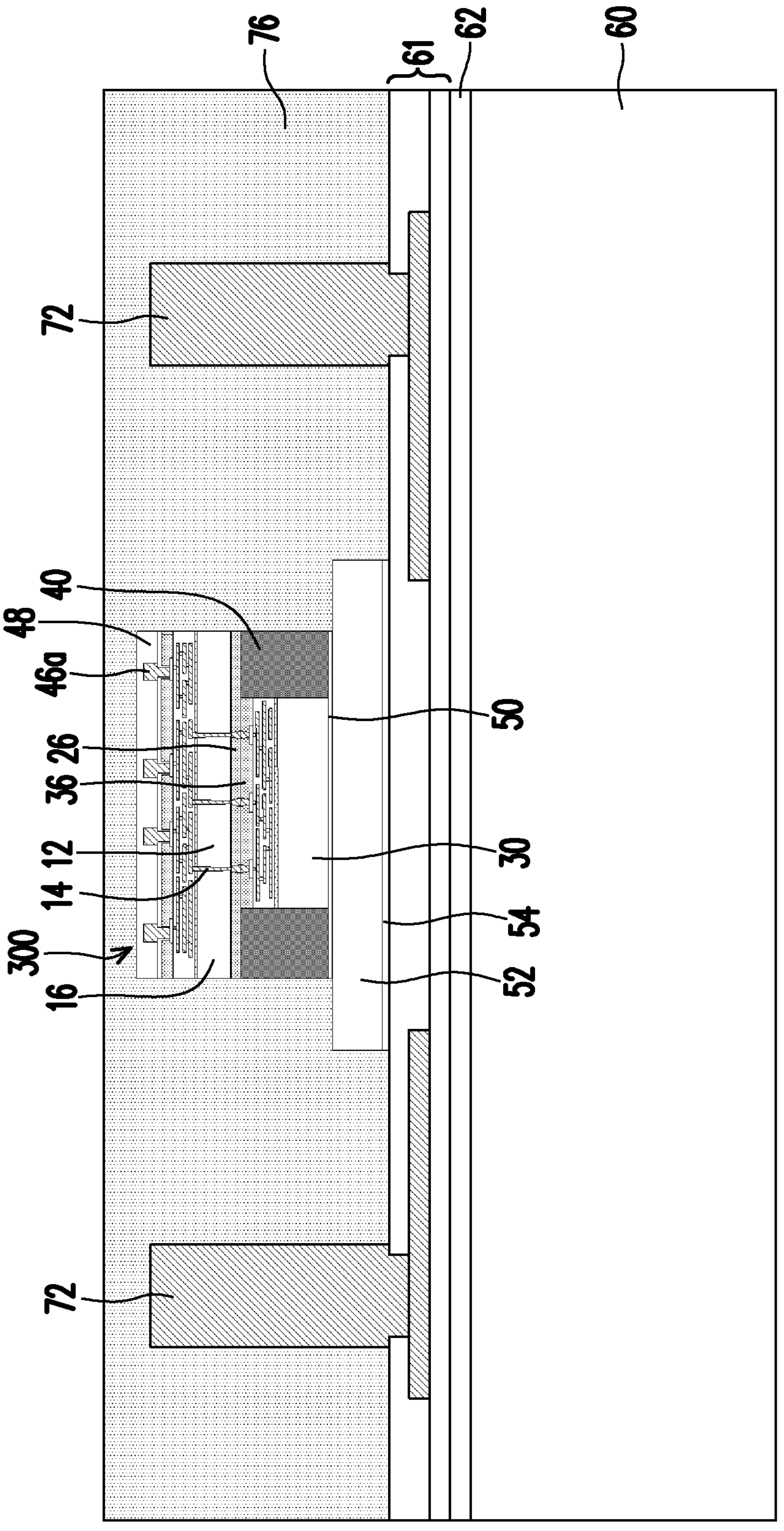
Figure 5G:
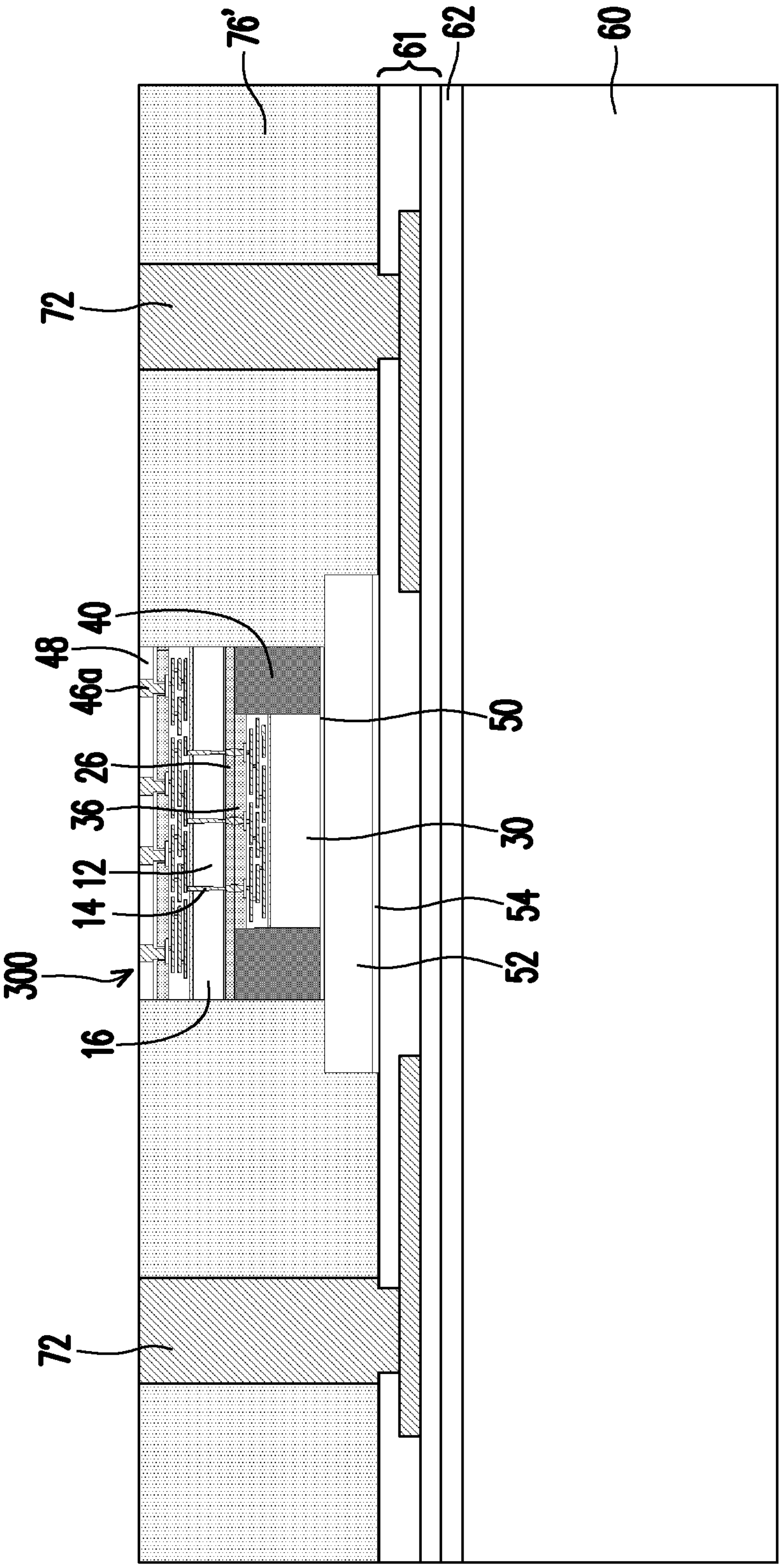
Figure 5H:
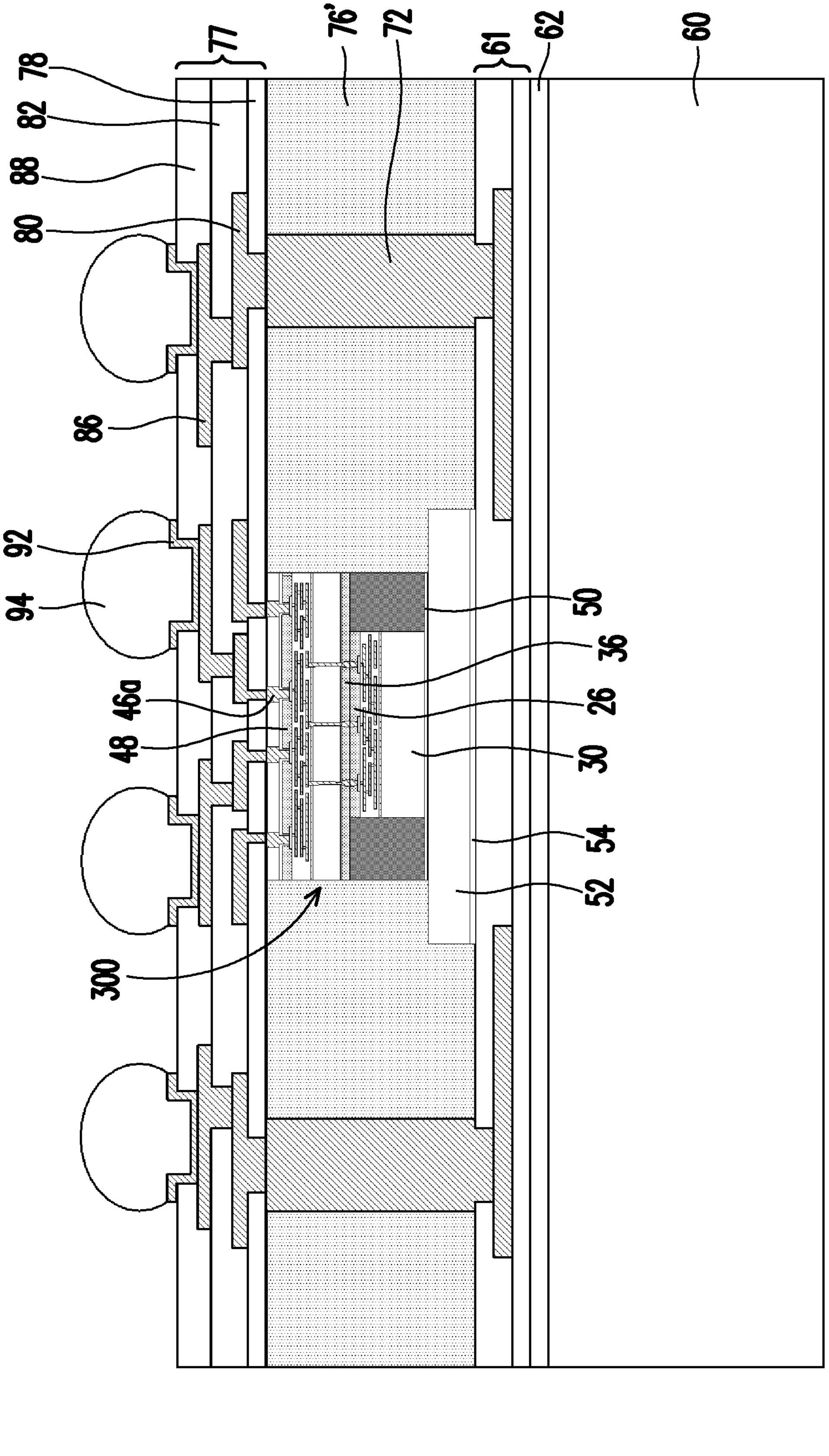

Referring FIG. 5E, after forming the conductive through vias 72, a thermal enhance component 52 (e.g., a het sink) and at least one chip stacking structure 300 are picked-up and placed over the dielectric layer 68 of the redistribution circuit structure 61. Only a single chip stacking structure 300 and its surrounding conductive through vias 72 are illustrated in FIG. 5E for illustrative purposes. It is noted, however, that the process steps shown in FIGS. 5A through 5I may be performed at wafer level, and may be performed on the thermal enhance component 52, multiple chip stacking structure 100 and the conductive through vias 72 disposed over the carrier 60. As illustrated in FIG. 5E, the attachment film 50 in the chip stacking structure 300 is adhered to the thermal enhance component 52.

Referring to FIGS. 5F through 5I, since the processes illustrated in FIGS. 5F through 5I are the same as that illustrated in FIGS. 2F through 2I, detailed descriptions regarding to the processes illustrated in FIGS. 5F through 5I are thus omitted.

Figure 5I:
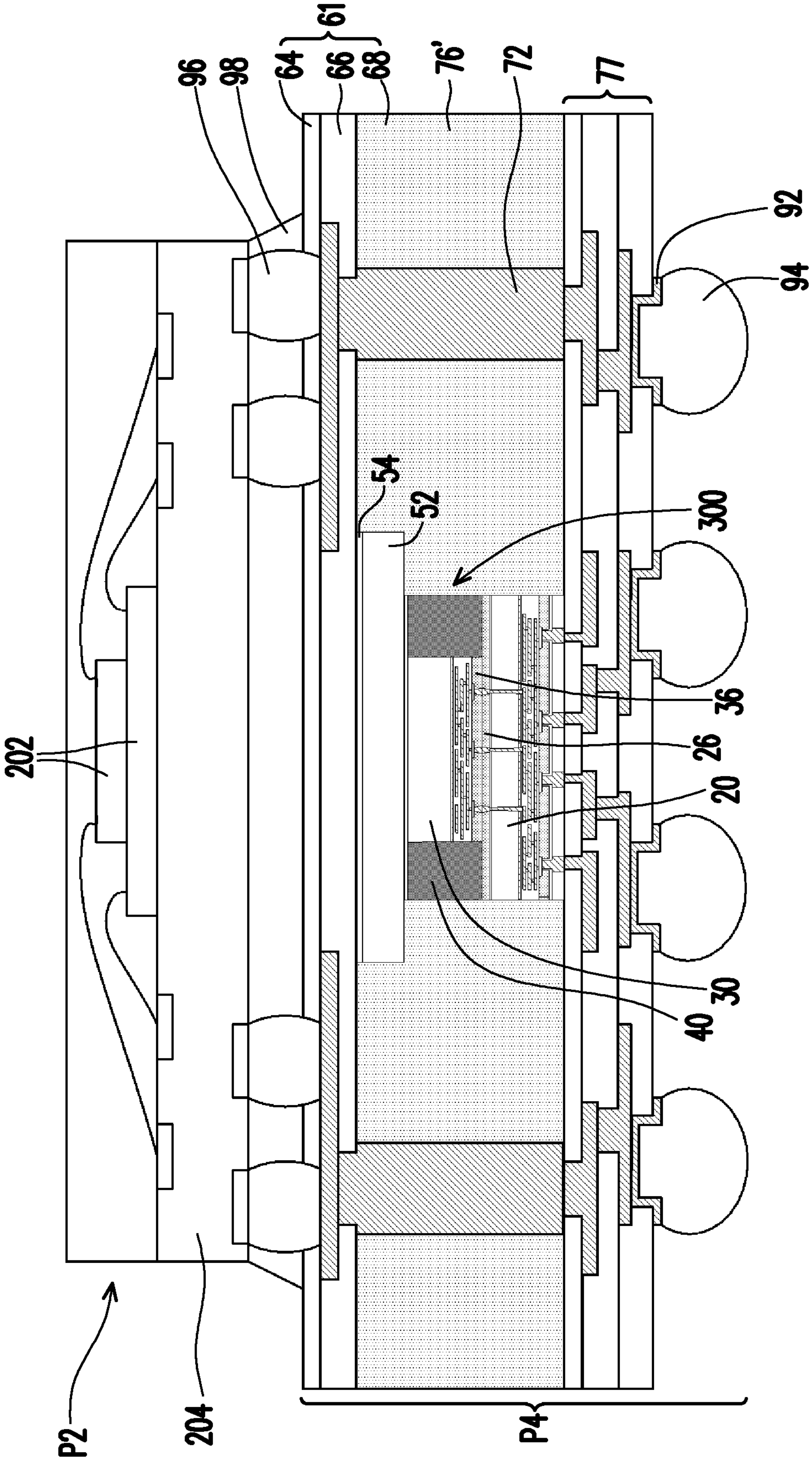

As illustrated in FIG. 5I, the integrated fanout package P4 includes a chip stacking structure 300 (i.e., a device die), a thermal enhance component 52 (e.g., a heat sink), conductive through vias 72, an insulating encapsulant 76', a redistribution circuit structure 61 and a redistribution circuit structure 77. The chip stacking structure 300, the thermal enhance component 52 and the conductive through vias 72 are laterally encapsulated by the insulating encapsulant 76'. The redistribution circuit structure 61 and the redistribution circuit structure 77 are respectively disposed on opposite sides of the insulating encapsulant 76'. The chip stacking structure 300 include a semiconductor die 20 (i.e., a bottom tier semiconductor die), a semiconductor die 30 (i.e., a top tier semiconductor die) and an insulating encapsulant 40. The semiconductor die 30 is stacked over and electrically connected to the semiconductor die 20. Furthermore, the insulating encapsulant 40 is disposed over the semiconductor die 20 and laterally encapsulates the semiconductor die 30.

FIGS. 6 through 9 are cross-sectional views schematically illustrating various PoP structures in accordance with some embodiments of the present disclosure.

Figure 6:
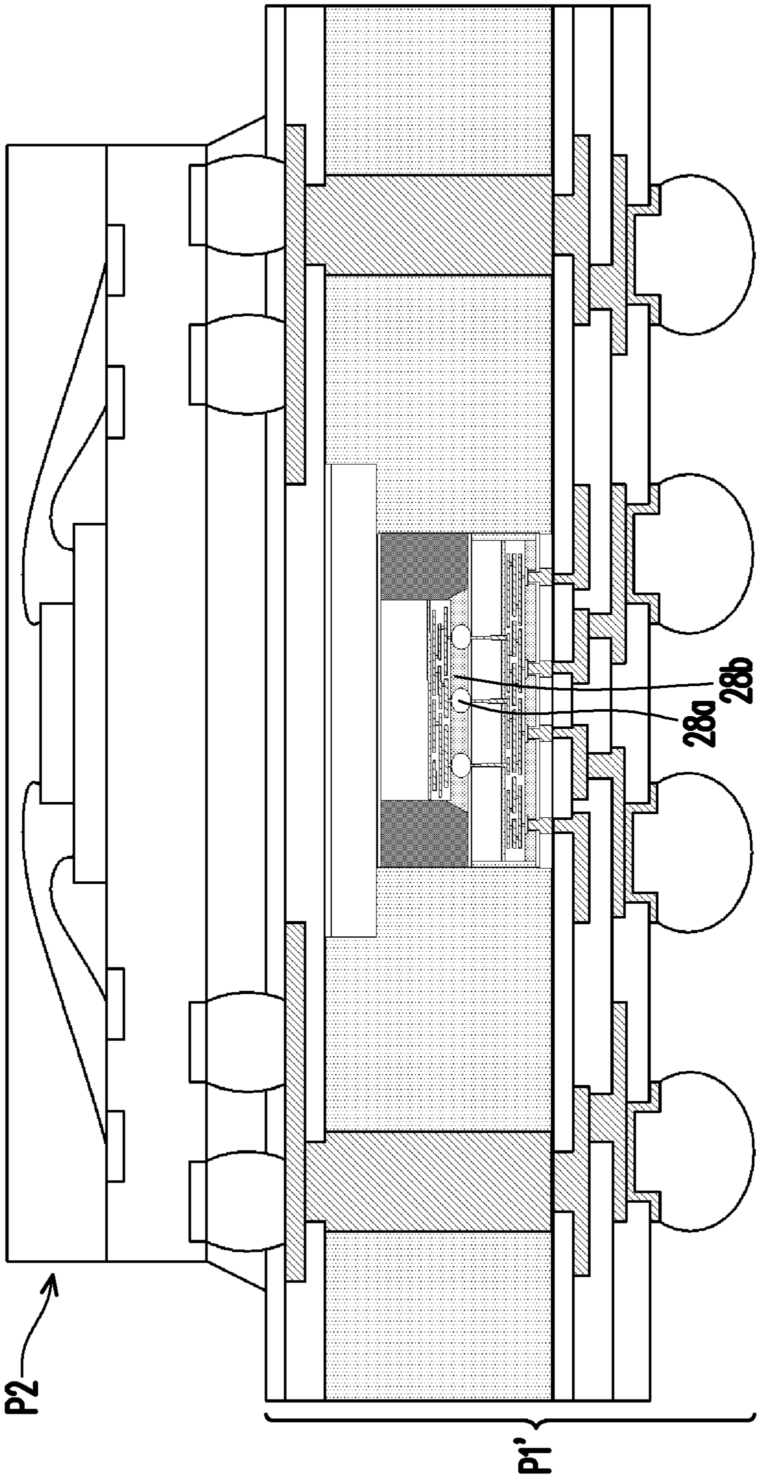
FIGS. 6 through 9 are cross-sectional views schematically illustrating various PoP structures in accordance with some embodiments of the present disclosure.

Referring to FIG. 2I and FIG. 6, the PoP structure illustrated in FIG. 6 is similar with the PoP structure illustrated in FIG. 2I except that the semiconductor die 20 and the semiconductor die 30 in the integrated fanout package P1' are bonded through conductive bumps 28*a* laterally encapsulated by an underfill 28*b*. The conductive bumps 28*a* are disposed between the semiconductor die 20 and the semiconductor die 30, and the semiconductor die 20 is electrically connected to the semiconductor die 30 through the conductive bumps 28*a*.

Figure 7:
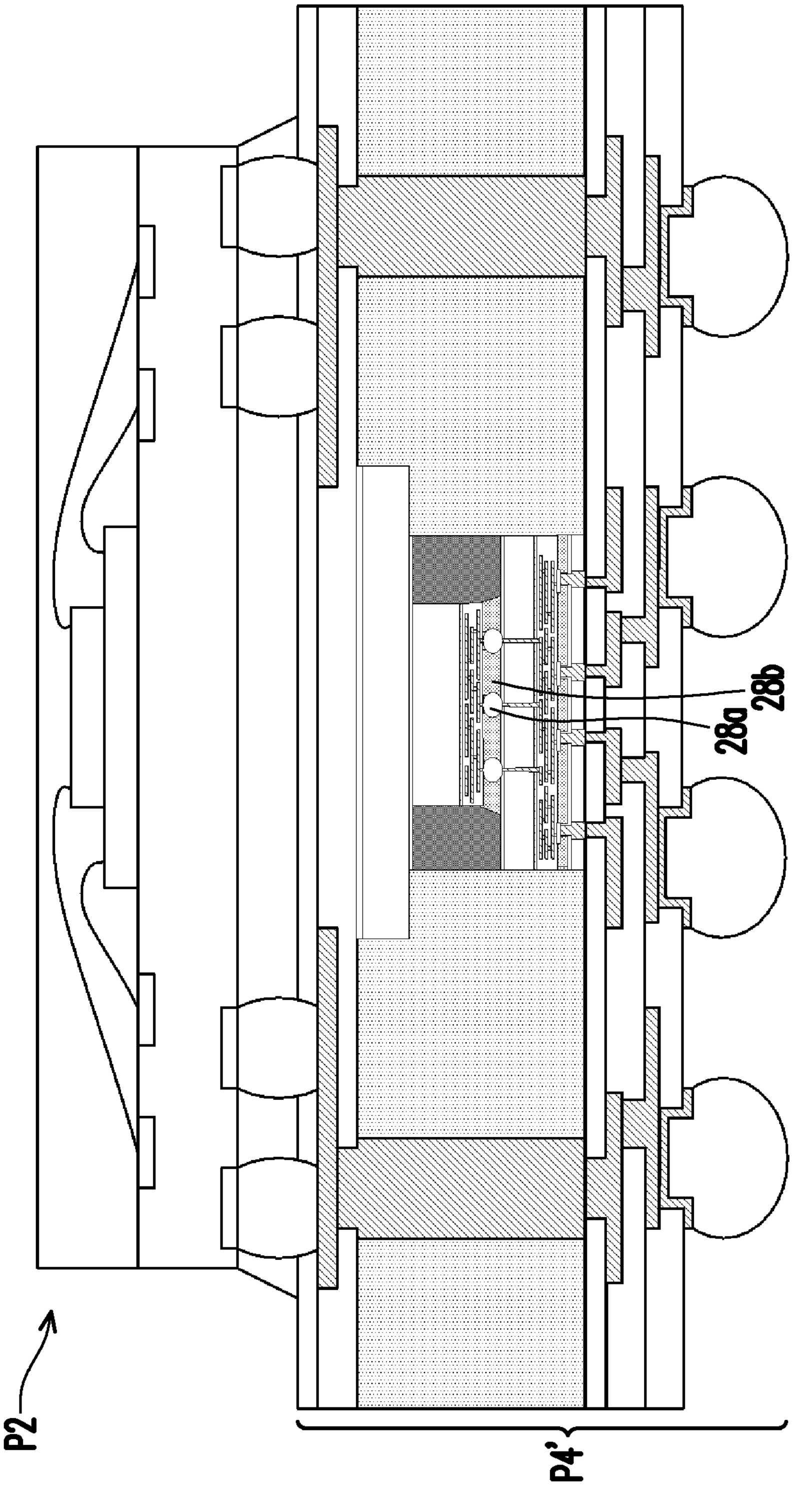

Referring to FIG. 5I and FIG. 7, the PoP structure illustrated in FIG. 7 is similar with the PoP structure illustrated in FIG. 5I except that the semiconductor die 20 and the semiconductor die 30 in the integrated fanout package P4' are bonded through conductive bumps 28*a* laterally encapsulated by an underfill 28*b*. The conductive bumps 28*a* are disposed between the semiconductor die 20 and the semiconductor die 30, and the semiconductor die 20 is electrically connected to the semiconductor die 30 through the conductive bumps 28*a*.

Figure 8:
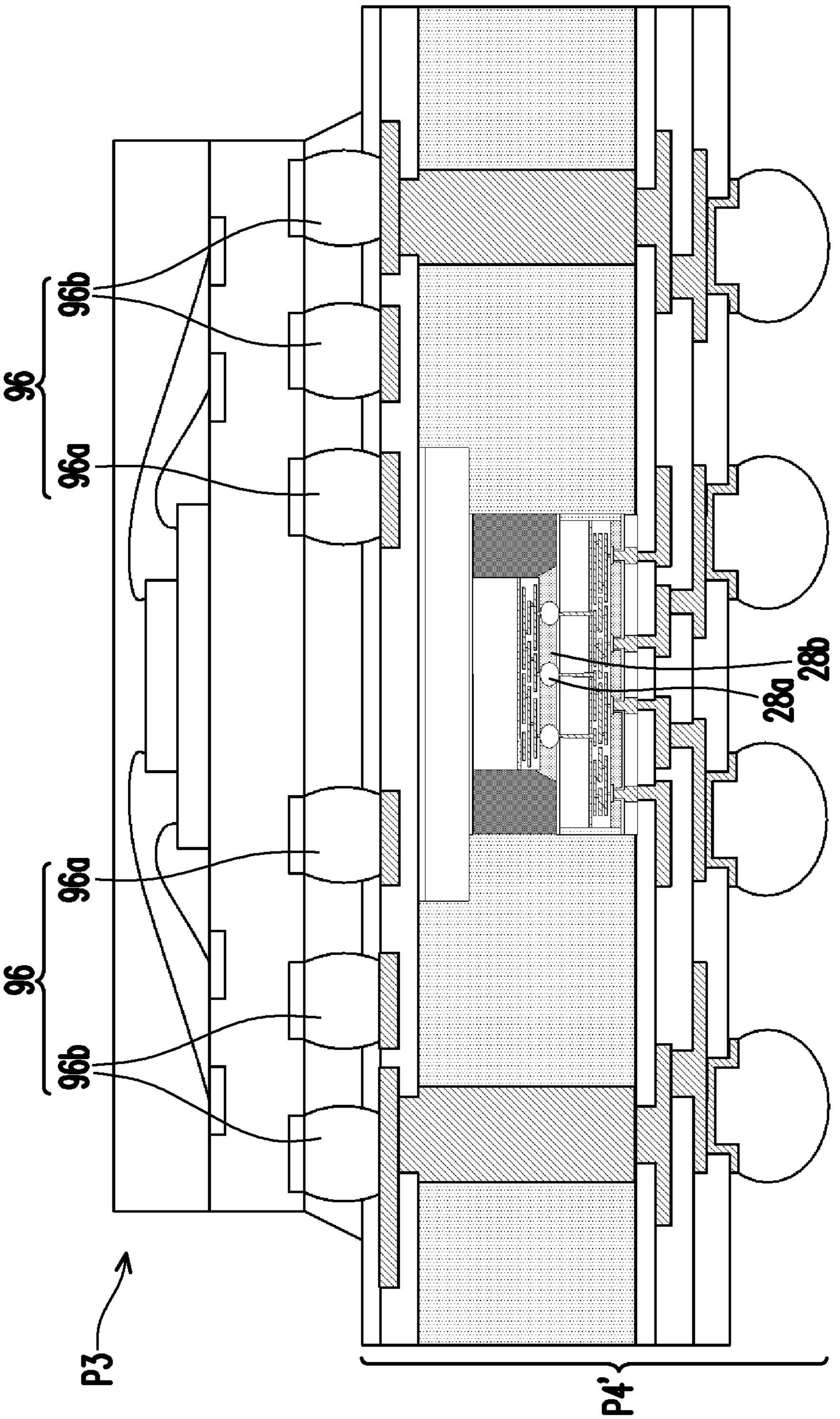

Referring to FIG. 6 and FIG. 8, the PoP structure illustrated in FIG. 8 is similar with the PoP structure illustrated in FIG. 6 except that the distribution of electrical connectors 96 of the top package P3 and the redistribution wirings 66 in the redistribution circuit structure 61. As illustrated in FIG. 8, at least one first electrical connectors 96*a* among the electrical connectors 96 is located above the thermal enhance component 52, and multiple second electrical connectors 96*b* among the electrical connectors 96 electrically connected to the redistribution circuit structure 61, and the second electrical connectors 96*b* are not located above the thermal enhance component 52. In some embodiments, the first electrical connector 96*a* is laterally surrounded by the second electrical connectors 96*b*.

Figure 9:
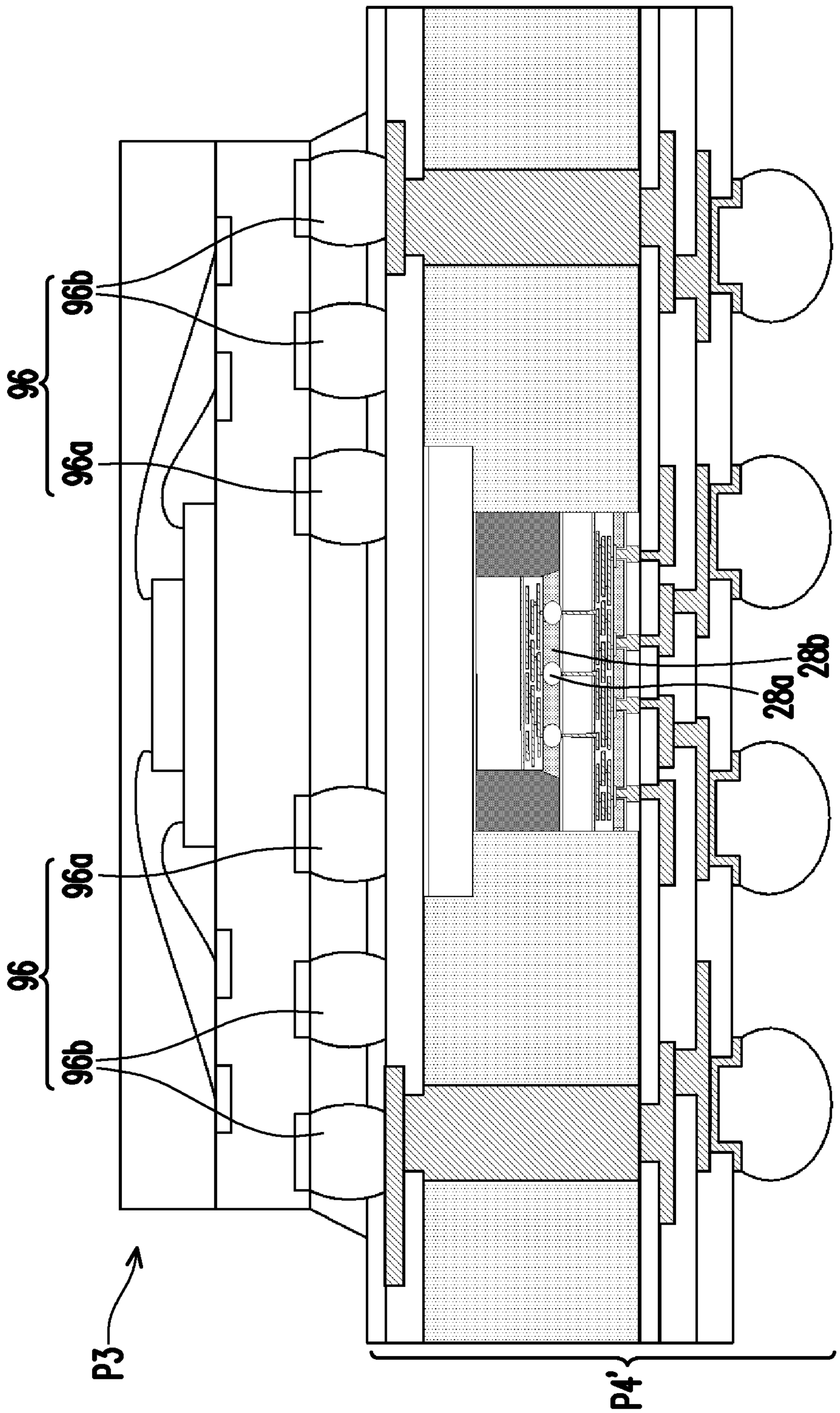

Referring to FIG. 7 and FIG. 9, the PoP structure illustrated in FIG. 9 is similar with the PoP structure illustrated in FIG. 7 except that the distribution of electrical connectors 96 of the top package P3 and the redistribution wirings 66 in the redistribution circuit structure 61. As illustrated in FIG. 9, at least one first electrical connectors 96*a* among the electrical connectors 96 is located above the thermal enhance component 52, and multiple second electrical connectors 96*b* among the electrical connectors 96 electrically connected to the redistribution circuit structure 61, and the second electrical connectors 96*b* are not located above the thermal enhance component 52. In some embodiments, the first electrical connector 96*a* is laterally surrounded by the second electrical connectors 96*b*.

In the above-mentioned embodiments, the thermal enhance component (e.g., silicon substrate, copper layer, copper alloy layer or other suitable thermal conductive material) is capable of providing thermal spreading effect without significant modification in process flow. The thermal enhance component provides an alternative architecture for die thickening idea but offering over twice efficient in thermal improvement while maintaining same overall package form-factor. Furthermore, in some embodiments, the thermal enhance component not only provides thermal enhancement (e.g., thermal enhancement ranges from about 3.7% to about 8.3%), but also offers mechanical support which effectively reduce crack risk at face-to-face interface, especially for oxide crack prevention in SoICs or molded-SoICs.

In accordance with some embodiments of the disclosure, a package structure including a chip stacking structure, a thermal enhance component and a first insulating encapsulant is provided. The thermal enhance component is stacked over and thermally coupled to the chip stacking structure, wherein a first lateral dimension of the thermal enhance component is greater than a second lateral dimension of the chip stacking structure. The first insulating encapsulant laterally encapsulates the thermal enhance component and the chip stacking structure. In some embodiments, the chip stacking structure includes a first semiconductor die, a second semiconductor die and a second insulating encapsulant, wherein the second semiconductor die is electrically connected to the first semiconductor die, the second semiconductor die is disposed between the first semiconductor die and the thermal enhance component, and the second insulating encapsulant laterally encapsulates the second semiconductor die. In some embodiments, the package structure further includes a third insulating encapsulant laterally encapsulating the first semiconductor die, wherein sidewalls of the third insulating encapsulant are substantially aligned with sidewalls of the second insulating encapsulant. In some embodiments, the chip stacking structure further includes conductive bumps disposed between the first semiconductor die and the second semiconductor die, and the second semiconductor die is electrically connected to the first semiconductor die through the conductive bumps. In some embodiments, the chip stacking structure further includes a first bonding structure and a second bonding structure, wherein the first bonding structure is disposed on a back surface of the first semiconductor die, the second bonding structure disposed on a front surface of the second semiconductor die, the first bonding structure and the second bonding structure are disposed between the first semiconductor die and the second semiconductor die, and the second semiconductor die is electrically connected to the first semiconductor die through the first bonding structure and the second bonding structure. In some embodiments, the package structure further includes a redistribution circuit structure disposed over the thermal enhance component and a surface of the first insulating encapsulant, wherein the thermal enhance component includes a semiconductor substrate or a conductive substrate, the semiconductor substrate or the conductive substrate is attached to the redistribution circuit structure through a first attachment film, and a top surface of the first attachment film is substantially level with the surface of the first insulating encapsulant. In some embodiments, the package structure further includes a redistribution circuit structure disposed on the thermal enhance component and a surface of the first insulating encapsulant, wherein the thermal enhance component includes a conductive layer, the conductive layer is in contact with the redistribution circuit structure, and a top surface of the conductive layer is substantially level with the surface of the first insulating encapsulant. In some embodiments, the package structure further includes a second attachment film disposed between the chip stacking structure and the thermal enhance component, wherein the chip stacking structure is thermally coupled to the thermal enhance component through the second attachment film.

In accordance with some other embodiments of the disclosure, a package structure including a first package and a second package is provided. The first package includes a first insulating encapsulant, a chip stacking structure, a heat sink and a redistribution circuit structure. The chip stacking structure is embedded in the first insulating encapsulant, and the chip stacking structure includes stacked semiconductor dies encapsulated by a second insulating encapsulant. The heat sink is embedded in the first insulating encapsulant, the heat sink is stacked over and thermally coupled to the stacked semiconductor die of the chip stacking structure, wherein a first lateral dimension of the thermal enhance component is greater than a second lateral dimension of the chip stacking structure. The redistribution circuit structure is disposed over the first insulating encapsulant and the heat sink. The second package is disposed over the redistribution circuit structure, wherein the second package comprises electrical connectors electrically connected to the redistribution circuit structure, and at least one first electrical connector among the electrical connectors is located above the heat sink. In some embodiments, the package structure further includes a first attachment film disposed between the heat sink and the redistribution circuit structure, wherein a lateral dimension of the first attachment film is greater than a lateral dimension of the chip stacking structure. In some embodiments, the package structure further includes a second attachment film disposed between the heat sink and the chip stacking structure, wherein the lateral dimension of the first attachment film is greater than a lateral dimension of the second attachment film. In some embodiments, a lateral dimension of the heat sink is greater than the lateral dimension of the second attachment film. In some embodiments, the package structure further includes conductive through vias penetrating though the first insulating encapsulant, wherein second electrical connectors among the electrical connectors land on and are electrically connected to the conductive through vias. In some embodiments, the at least one first electrical connector is surrounded by the second electrical connectors.

In accordance with some other embodiments of the disclosure, a package structure including a chip stacking structure, a thermal enhance component, conductive through vias and a first insulating encapsulant is provided. The thermal enhance component is stacked over and thermally coupled to the chip stacking structure. The conductive through vias are disposed to surround the chip stacking structure and the thermal enhance component. The first insulating encapsulant laterally encapsulates the thermal enhance component, the chip stacking structure and the conductive through vias, wherein a first minimum lateral distance between the conductive through vias and the thermal enhance component is smaller than a second minimum lateral distance between the conductive through vias and the chip stacking structure. In some embodiments, the chip stacking structure includes a first semiconductor die, a second semiconductor die and a second insulating encapsulant, wherein the second semiconductor die is electrically connected to the first semiconductor die, the second semiconductor die is disposed between the first semiconductor die and the thermal enhance component, and the second insulating encapsulant laterally encapsulates the second semiconductor die. In some embodiments, the package structure further includes a third insulating encapsulant laterally encapsulating the first semiconductor die, wherein sidewalls of the third insulating encapsulant are substantially aligned with sidewalls of the second insulating encapsulant. In some embodiments, the chip stacking structure further includes conductive bumps disposed between the first semiconductor die and the second semiconductor die, and the second semiconductor die is electrically connected to the first semiconductor die through the conductive bumps. In some embodiments, the chip stacking structure further includes a first bonding structure and a second bonding structure, wherein the first bonding structure is disposed on a back surface of the first semiconductor die, the second bonding structure is disposed on a front surface of the second semiconductor die, the first bonding structure and the second bonding structure are disposed between the first semiconductor die and the second semiconductor die, and the second semiconductor die is electrically connected to the first semiconductor die through the first bonding structure and the second bonding structure. In some embodiments, the package structure further includes a top package stacked over the thermal enhance component and the conductive through vias, wherein the thermal enhance component is disposed between the chip stacking structure and the top package, and the top package comprises at least one first electrical connector located above the thermal enhance component and second electrical connectors land on the conductive through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a chip stacking structure a thermal enhance component stacked over and thermally coupled to the chip stacking structure, wherein the thermal enhance component extends across the chip stacking structure continuously;

a conductive through via disposed aside the chip stacking structure and the thermal enhance component, wherein a first minimum lateral distance between the conductive through via and the thermal enhance component is smaller than a second minimum lateral distance between the conductive through via and the chip stacking structure;

a first insulating encapsulant laterally encapsulating the thermal enhance component, the conductive through via and the chip stacking structure;

a redistribution circuit structure disposed over the thermal enhance component, the conductive through via and a surface of the first insulating encapsulant; and a first attachment film, wherein the thermal enhance component is attached to the redistribution circuit structure through the first attachment film, wherein the chip stacking structure comprises:

a first semiconductor die;

a second semiconductor die electrically connected to the first semiconductor die, wherein the second semiconductor die is disposed between the first semiconductor die and the thermal enhance component;

a second insulating encapsulant laterally encapsulating the second semiconductor die;

a first bonding structure disposed on a back surface of the first semiconductor die;

a second bonding structure disposed on a front surface of the second semiconductor die, wherein the first bonding structure and the second bonding structure are disposed between the first semiconductor die and the second semiconductor die;

a third insulating encapsulant laterally encapsulating the first semiconductor die, wherein sidewalls of the third insulating encapsulant are substantially aligned with sidewalls of the second insulating encapsulant.

2. The package structure of claim 1, wherein the thermal enhance component has a continuous top surface with a first width in a direction, the second semiconductor die has a second width in the direction, and the second width is smaller than the first width, the first attachment film has a third width in the direction, the second width is smaller than the third width.

3. The package structure of claim 1, wherein the first semiconductor die is laterally spaced apart from the first insulating encapsulant by the third insulating encapsulant.

4. The package structure of claim 1, the first semiconductor die is in contact with the first insulating encapsulant.

5. The package structure of claim 1, wherein sidewalls of the second insulating encapsulant substantially align with sidewalls of the first bonding structure.

6. The package structure of claim 1, wherein the thermal enhance component comprises a semiconductor substrate or a conductive substrate, the semiconductor substrate or the conductive substrate is attached to the redistribution circuit structure through the first attachment film, and a top surface of the first attachment film is substantially level with the surface of the first insulating encapsulant.

7. The package structure of claim 1, wherein a top surface of the first attachment film is substantially level with the surface of the first insulating encapsulant.

8. The package structure of claim 1 further comprising:

a second attachment film disposed between the chip stacking structure and the thermal enhance component, wherein the chip stacking structure is thermally coupled to the thermal enhance component through the second attachment film.

9. A package structure, comprising:

a first package, comprising:

a first insulating encapsulant;

a chip stacking structure embedded in the first insulating encapsulant, and the chip stacking structure comprising stacked semiconductor dies;

a heat sink embedded in the first insulating encapsulant, the heat sink being stacked over and thermally coupled to the stacked semiconductor dies of the chip stacking structure, wherein the heat sink extends across the chip stacking structure continuously;

a conductive through via disposed aside the chip stacking structure and the heat sink, wherein a first minimum lateral distance between the conductive through via and the heat sink is smaller than a second minimum lateral distance between the conductive through via and the chip stacking structure; and a redistribution circuit structure disposed over the first insulating encapsulant and the heat sink; and a second package disposed over the redistribution circuit structure, wherein the second package comprises electrical connectors electrically connected to the redistribution circuit structure, and at least one first electrical connector among the electrical connectors is located above the heat sink;

a first attachment film disposed between the heat sink and the redistribution circuit structure; and a second attachment film disposed between the heat sink and the chip stacking structure, wherein a first lateral dimension of the first attachment film is greater than a second lateral dimension of the second attachment film.

10. The package structure of claim 9, wherein the first lateral dimension of the first attachment film is greater than a third lateral dimension of the chip stacking structure.

11. The package structure of claim 10, wherein a fourth lateral dimension of the heat sink is greater than the third lateral dimension of the chip stacking structure.

12. The package structure of claim 11, wherein a fourth lateral dimension of the heat sink is greater than the second lateral dimension of the second attachment film.

13. The package structure of claim 9, wherein second electrical connectors among the electrical connectors are electrically connected to the redistribution circuit structure, and the second electrical connectors are not located above the heat sink.

14. The package structure of claim 13, wherein the at least one first electrical connector is surrounded by the second electrical connectors.

15. A package structure, comprising:

a chip stacking structure comprising a first semiconductor die, a second semiconductor die, a first bonding structure, a second bonding structure, and a first inner insulating encapsulant, wherein the second semiconductor die and the second bonding structure are laterally encapsulated by the first inner insulating encapsulant, the first inner insulating encapsulant is spaced apart from the first semiconductor die by the first bonding structure, and sidewalls of the first bonding structure are substantially align with sidewalls of the first inner insulating encapsulant;

a thermal enhance component stacked over and thermally coupled to the chip stacking structure, wherein the thermal enhance component extends across the chip stacking structure continuously;

conductive through vias disposed to surround the chip stacking structure and the thermal enhance component;

an outer insulating encapsulant laterally encapsulating the thermal enhance component, the chip stacking structure and the conductive through vias, wherein a first minimum lateral distance between the conductive through vias and the thermal enhance component is smaller than a second minimum lateral distance between the conductive through vias and the chip stacking structure;

a redistribution circuit structure disposed over the thermal enhance component and the outer insulating encapsulant; and an attachment film, wherein the thermal enhance component is attached to the redistribution circuit structure through the attachment film, and the attachment film extends across the chip stacking structure continuously.

16. The package structure of claim 15, wherein the chip stacking structure further comprises a second inner insulating encapsulant laterally encapsulating the first semiconductor die.

17. The package structure of claim 16, wherein sidewalls of the second inner insulating encapsulant are substantially align with sidewalls of the first bonding structure and sidewalls of the first inner insulating encapsulant.

18. The package structure of claim 15, wherein the first semiconductor die is in contact with the outer insulating encapsulant.

19. The package structure of claim 16, wherein the second semiconductor die is laterally spaced apart from the outer insulating encapsulant by the first inner insulating encapsulant, and the first semiconductor die is laterally spaced apart from the outer insulating encapsulant by the second inner insulating encapsulant.

20. The package structure of claim 15 further comprising: a top package stacked over the thermal enhance component and the through vias, wherein the thermal enhance component is disposed between the chip stacking structure and the top package, and the top package comprises at least one first electrical connector and second electrical connectors, the at least one first electrical connector is located above the thermal enhance component, and the second electrical connectors are not located above the thermal enhance component.

* * * * *